US012707647B2

(12) United States Patent
Mariani et al.

(10) Patent No.: US 12,707,647 B2
(45) Date of Patent: Aug. 11, 2026

(54) ARRAY OF CAPACITORS, AN ARRAY OF MEMORY CELLS, METHOD USED IN FORMING AN ARRAY OF MEMORY CELLS, AND METHOD USED IN FORMING AN ARRAY OF CAPACITORS

(71) Applicant: Micron Technology, Inc., Boise, ID (US)

(72) Inventors: Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 415 days.

(21) Appl. No.: 18/503,756

(22) Filed: Nov. 7, 2023

(65) Prior Publication Data

US 2024/0206190 A1 Jun. 20, 2024

Related U.S. Application Data

(60) Provisional application No. 63/433,969, filed on Dec. 20, 2022.

(51) Int. Cl.
*H10B 53/30* (2023.01)

(52) U.S. Cl.
CPC .................................... *H10B 53/30* (2023.02)

(58) Field of Classification Search
CPC ........ H10B 53/30; H10B 63/10; H10B 63/34; H10B 12/312; H10B 53/20; H10B 12/31;
(Continued)

(56) References Cited

U.S. PATENT DOCUMENTS

2020/0051849 A1 * 2/2020 Ramaswamy ...... H10W 10/021
2020/0111800 A1 * 4/2020 Ramaswamy ......... H10B 53/30

OTHER PUBLICATIONS

Stevens, et al., "Area-Selective Atomic Layer Deposition of TiN, TiO2, and HfO2 on Silicon Nitride with inhibition on Amorphous Carbon", Chemistry of Materials, 2018, United States, pp. 3223-3232.

* cited by examiner

*Primary Examiner* — Wasiul Haider
(74) *Attorney, Agent, or Firm* — Wells St. John P.S.

(57) ABSTRACT

A method used in forming an array of capacitors comprises forming first walls along a column direction and second walls along a row direction. The first and second walls individually comprise a first material directly above a second material. The first and second materials are of different compositions relative one another. All of the second material is removed from being directly under the first material in the second walls to form beams that are elongated along the row direction and are suspended between immediately-adjacent of the first walls and to leave the second material directly under the first material in the first walls. Third walls are formed along the row direction. The third walls comprise third material that is of different composition from those of the first and second materials. The third material of individual of the third walls circumferentially-covers the beams. Conductive material is grown over the first and second materials selectively relative to the third material. The selectively-grown conductive material is vertically-along sidewalls of the first walls and comprising first capacitor electrodes. The third walls are removed after the selectively growing. After removing the third walls, a capacitor insulator is formed over the first capacitor electrodes and that circumferentially-covers the beams. Second capacitor electrodes are formed over the capacitor insulator to form a plurality of capacitors that individually comprise one of the first capacitor electrodes, the capacitor insulator, and one of the second capacitor electrodes. The second capacitor electrodes are common to multiple of the capacitors. Other embodiments, including structure, are disclosed.

25 Claims, 28 Drawing Sheets

(58) Field of Classification Search
CPC ..... H10B 53/00; H10W 90/00; H10D 80/215; H10D 1/60; H10D 1/00
See application file for complete search history.

ARRAY OF CAPACITORS, AN ARRAY OF MEMORY CELLS, METHOD USED IN FORMING AN ARRAY OF MEMORY CELLS, AND METHOD USED IN FORMING AN ARRAY OF CAPACITORS

TECHNICAL FIELD

Embodiments disclosed herein pertain to arrays of capacitors, to arrays of memory cells, to methods used in forming an array of memory cells, and to methods used in forming an array of capacitors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a “0” or a “1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as a charge may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, in such instances, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

DETAILED DESCRIPTION OF EXAMPLE EMBODIMENTS

Embodiments of the invention include methods used in forming an array of capacitors, for example as may be used in memory or other integrated circuitry. Embodiments of the invention also encompass methods used in forming an array of memory cells, for example comprising a plurality of vertical transistors that are above a plurality of capacitors. Embodiments of the invention also encompass an array of capacitors and an array of memory cells independent of method of manufacture. Example embodiments of methods of forming an array of memory cells are described with reference to FIGS. 1-29.

Figure 1:
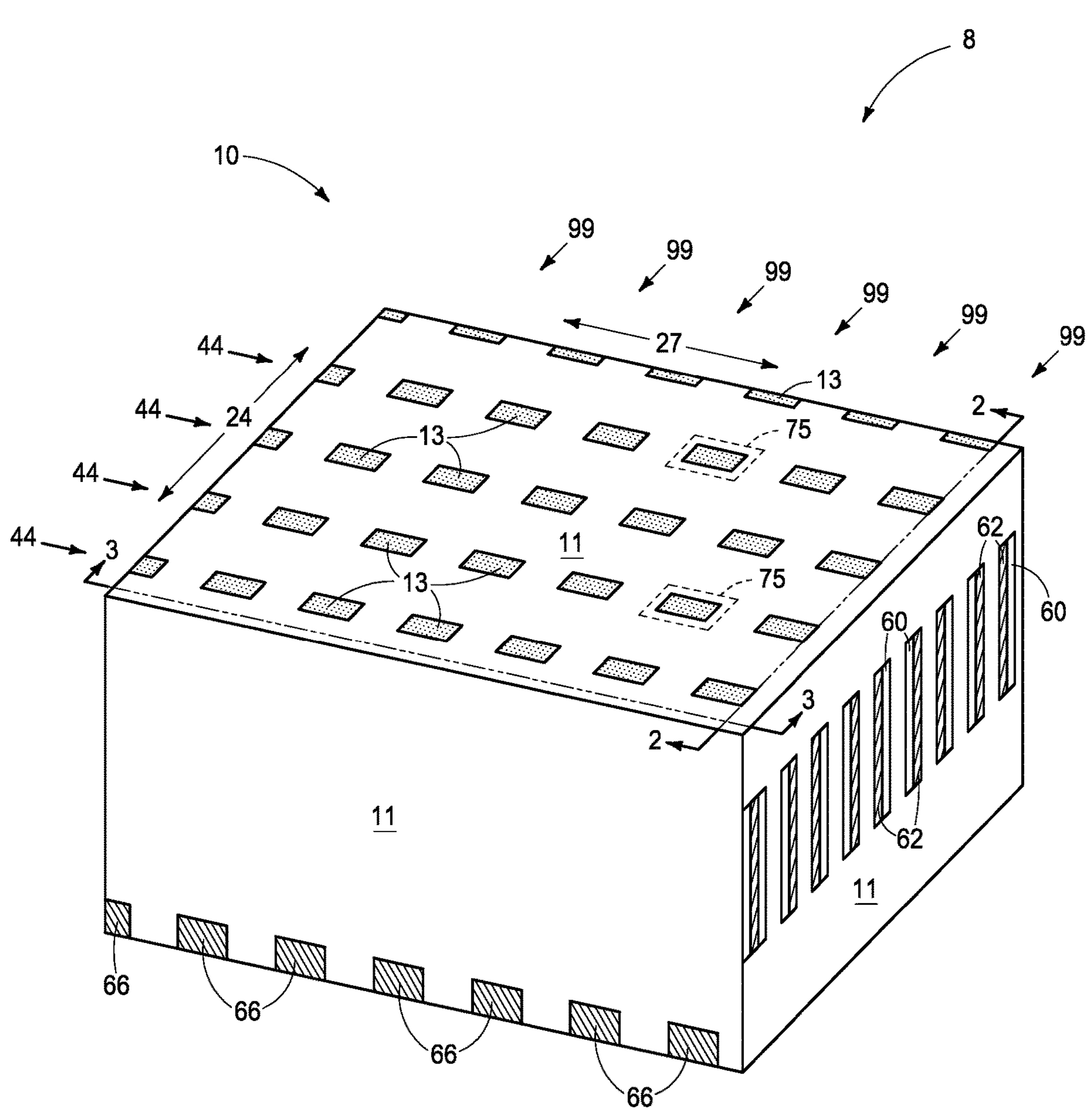
FIG. 1 is a diagrammatic perspective view of a portion of a substrate in process in accordance with an embodiment of the invention.
Figure 2:
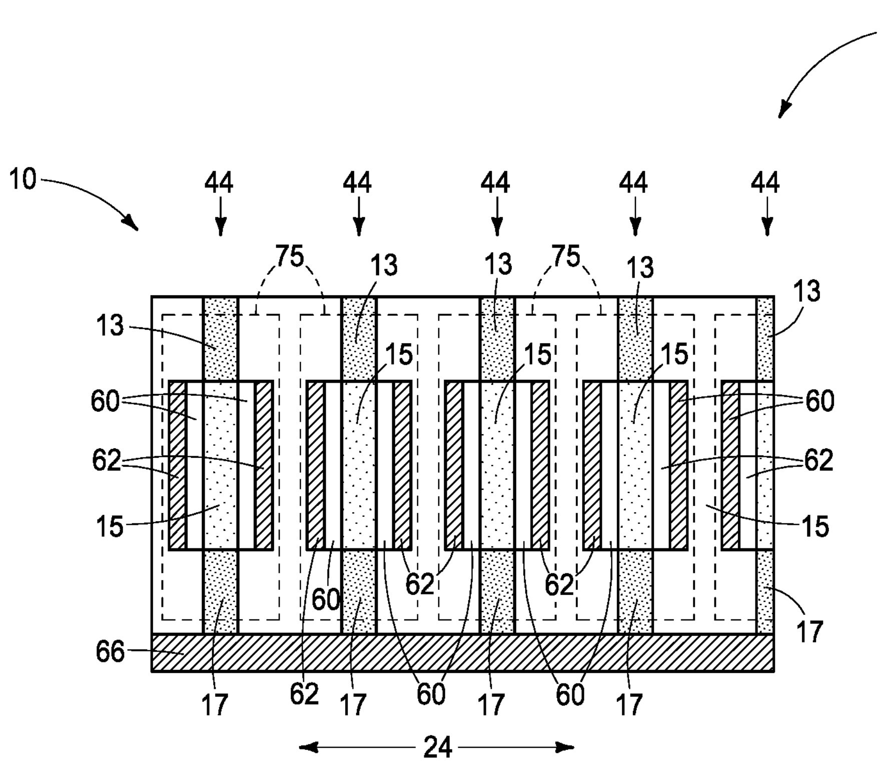
FIGS. 2-29 are diagrammatic sequential sectional, expanded, enlarged, perspective, and/or partial views of the construction of FIG. 1, or portions thereof, and/or alternate embodiments in process in accordance with some embodiments of the invention.
Figure 3:
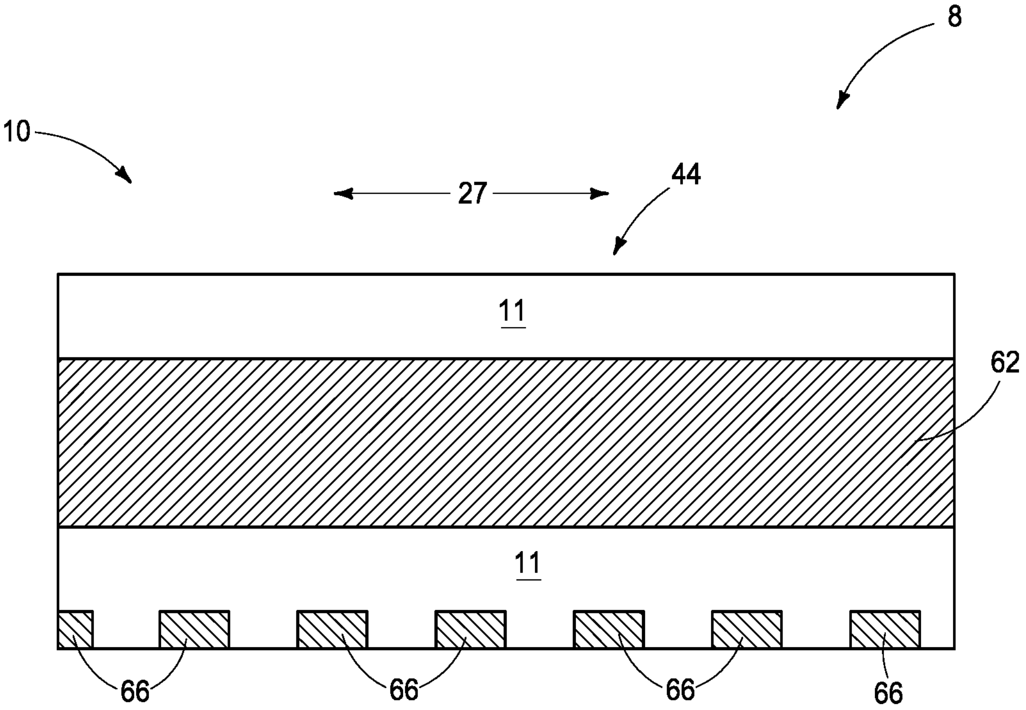

Referring to FIGS. 1-3, such shows an example substrate construction 8 comprising an array or array area 10. Such may be fabricated relative to a base substrate (not show) that may comprise any of conductive/conductor/conducting, semiconductive/semiconductor/semiconducting, and insulative/insulator/insulating (i.e., electrically herein) materials. Materials may be aside, elevationally inward, or elevationally outward of the FIGS. 1-3—depicted materials. For example, other partially or wholly fabricated components of integrated circuitry may be provided somewhere above, about, or within a base substrate (not shown). Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

A plurality of vertical transistors 75 have been formed in rows 44 along a row direction 27 and in columns 99 along a column direction 24. Vertical transistors 75 individually comprise a top source/drain region 13, a bottom source/drain region 17, and a channel region 15 vertically there-between. A plurality of gate lines 62 are individually operatively laterally-proximate channel regions 15 along individual rows 44 (e.g., a gate insulator 60 being laterally-between channel regions 15 and gate lines 62). Two gate lines 62 are shown as sandwiching individual channel regions 15, although channel regions 15 may alternately have only a single gate line (i.e., be single-sided and not shown). A plurality of digitlines 66 is below gate lines 62 and are individually directly electrically coupled to bottom source/drain regions 17 along individual columns 99. Example insulator material 11 (e.g., silicon dioxide and/or silicon nitride) is shown surrounding the various components.

Figure 4:
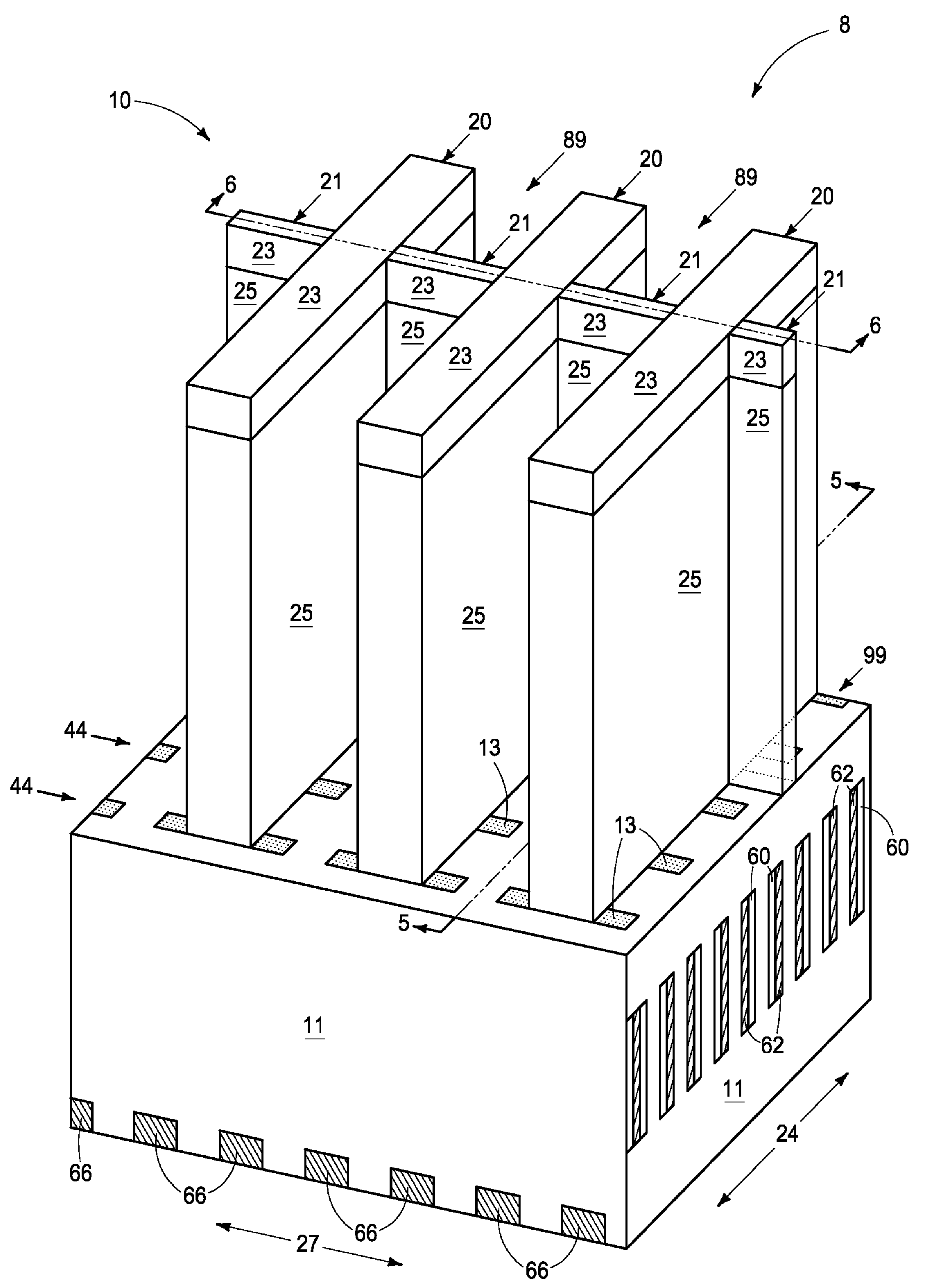
Figure 5:
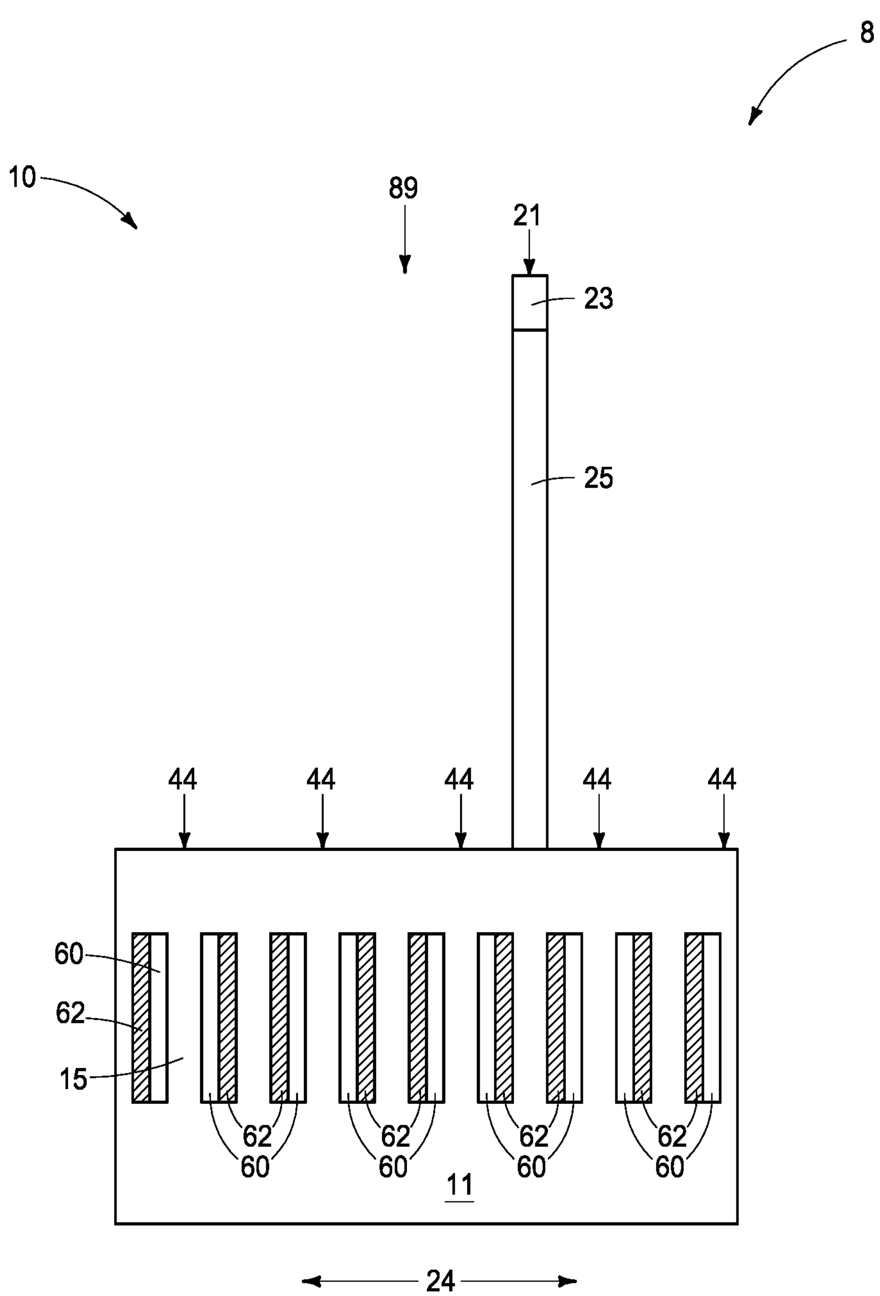
Figure 6:
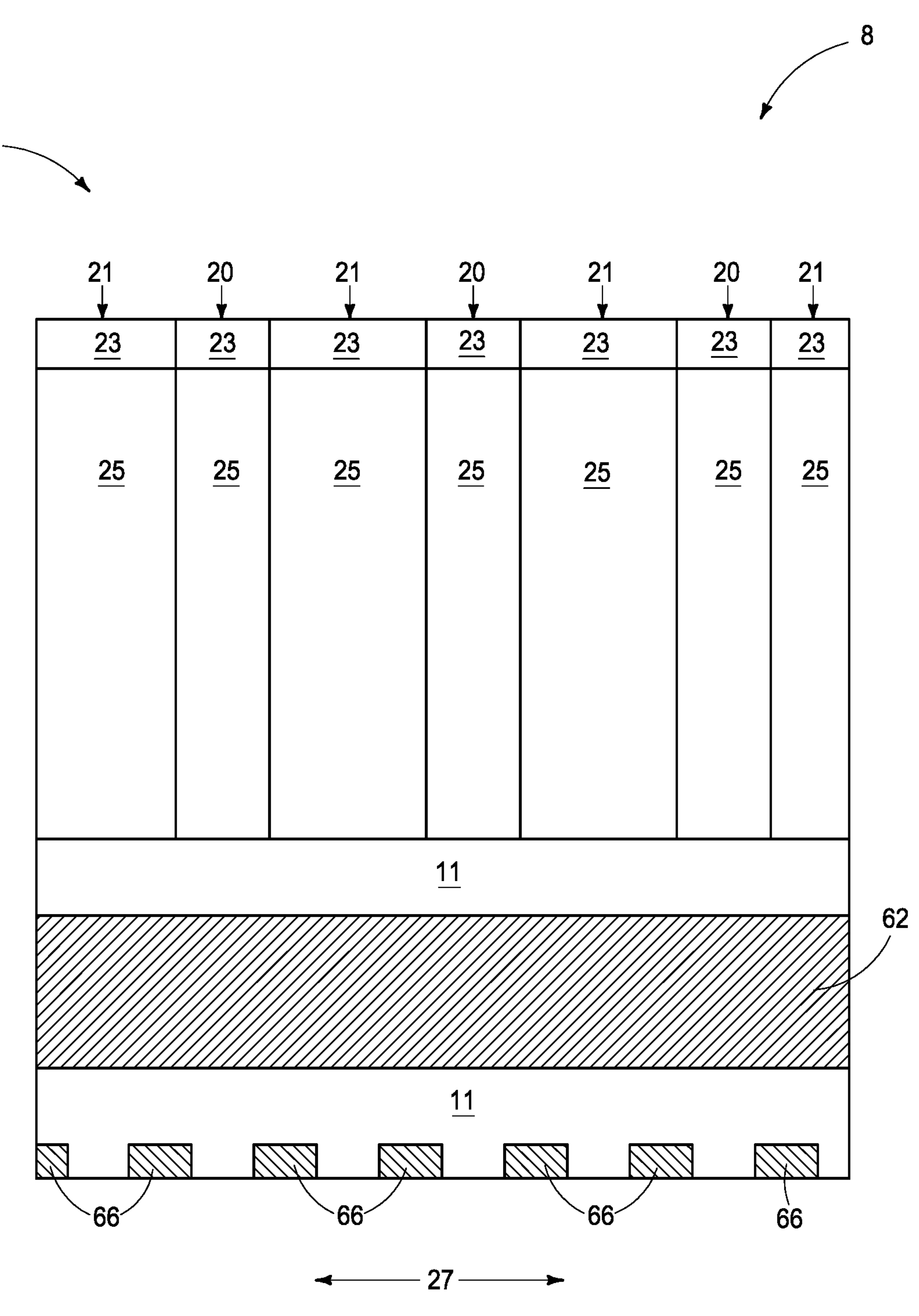

Referring to FIGS. 4-6, first walls 20 have been formed along column direction 24 (forming trenches 89 there-between) and second walls 21 (one being shown) have been formed along row direction 27. First walls 20 and/or second walls 21 may have sidewalls that taper laterally-inward or laterally-outward relative one another (neither being shown). First and second walls 20, 21 individually comprise a first material 23 (e.g., silicon nitride) directly above a second material 25 (e.g., silicon dioxide), with first and second materials 23, 25 being of different compositions relative one another. In one embodiment, second material 25 is insulative and remains in a finished-circuitry construction encompassing the array of memory cells being fabricated. FIGS. 4-6 shows an embodiment where second material 25 of first walls 20 is laterally-wider than second material 25 of second walls 21, and in one such embodiment where first material 23 of first walls 20 is laterally-wider than first material 23 of second walls 21.

Example first walls 20 are individually shown as being between immediately-adjacent columns 99 (at least some such columns) of top source/drain regions 13. Further in one embodiment, second walls 21 are individually between immediately-adjacent rows 44 (at least some such rows) of top source/drain regions 13. Example second walls 21 may only be between every ten to thirty rows 44 of top source/drain regions 13, with only one example second wall 21 being shown due to scale.

Figure 7:
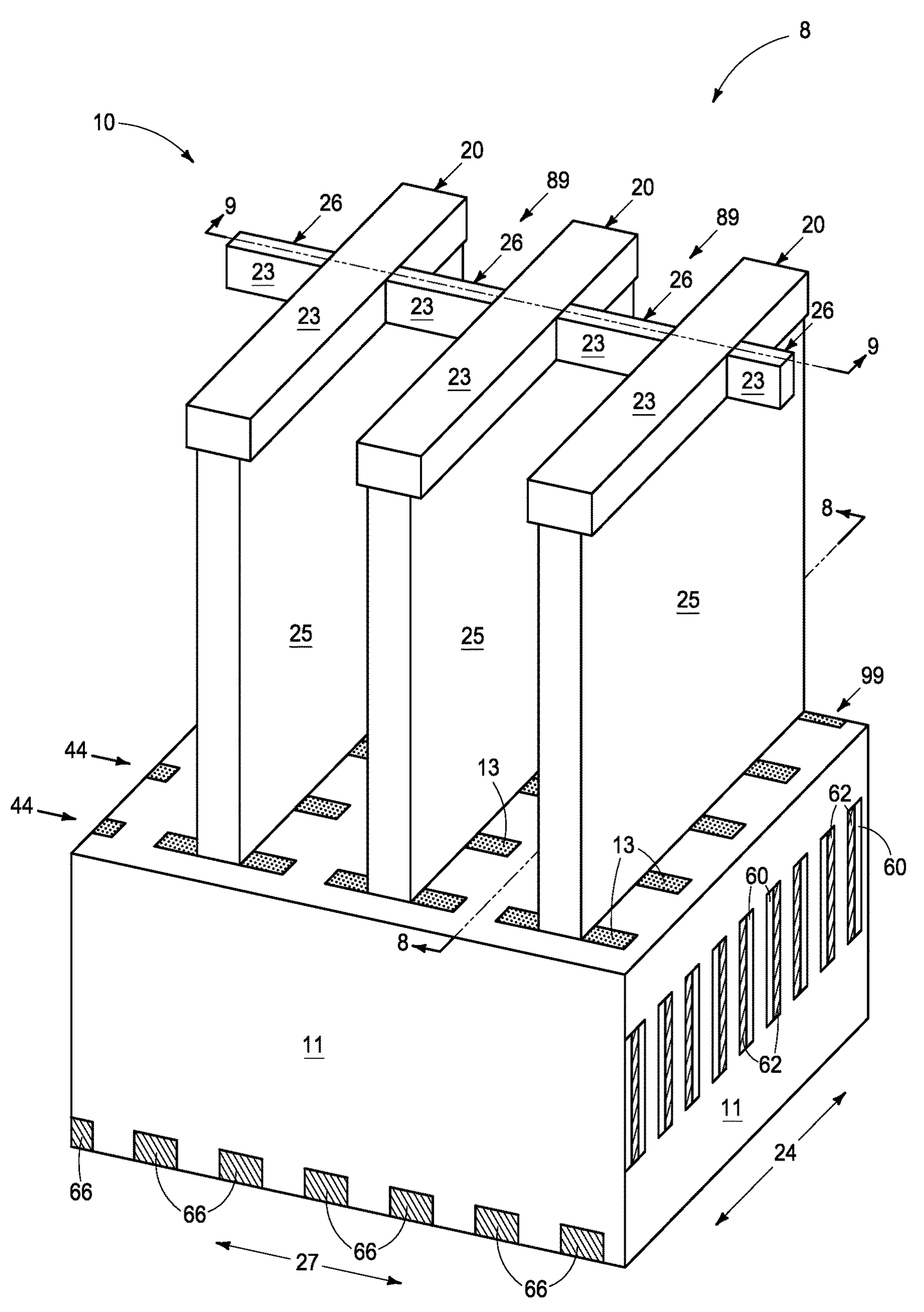
Figure 8:
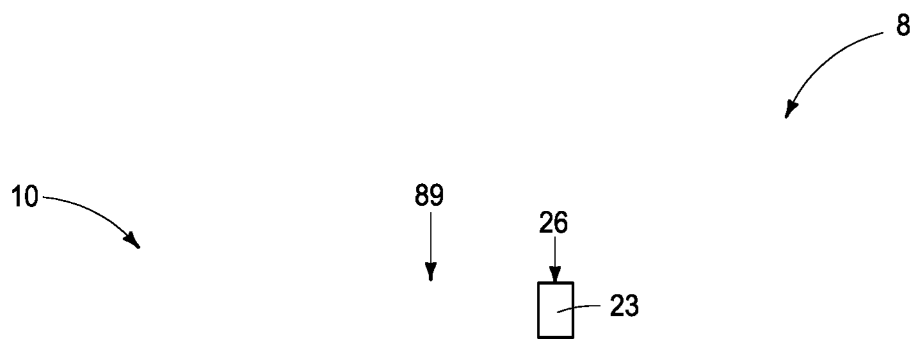
Figure 8:
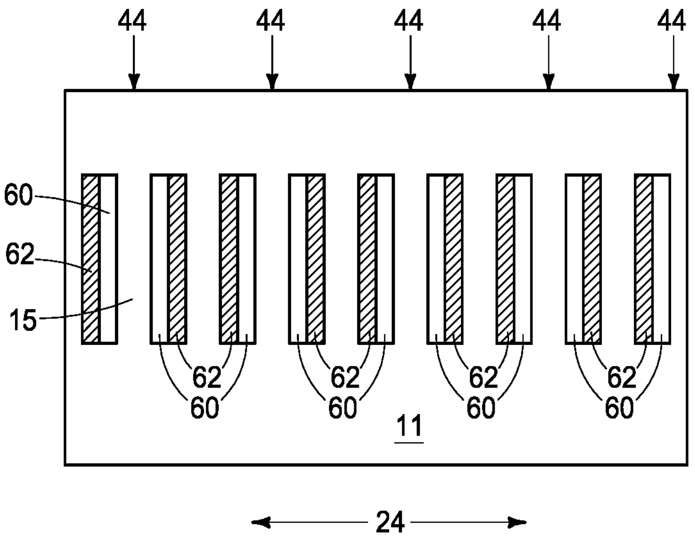
Figure 9:
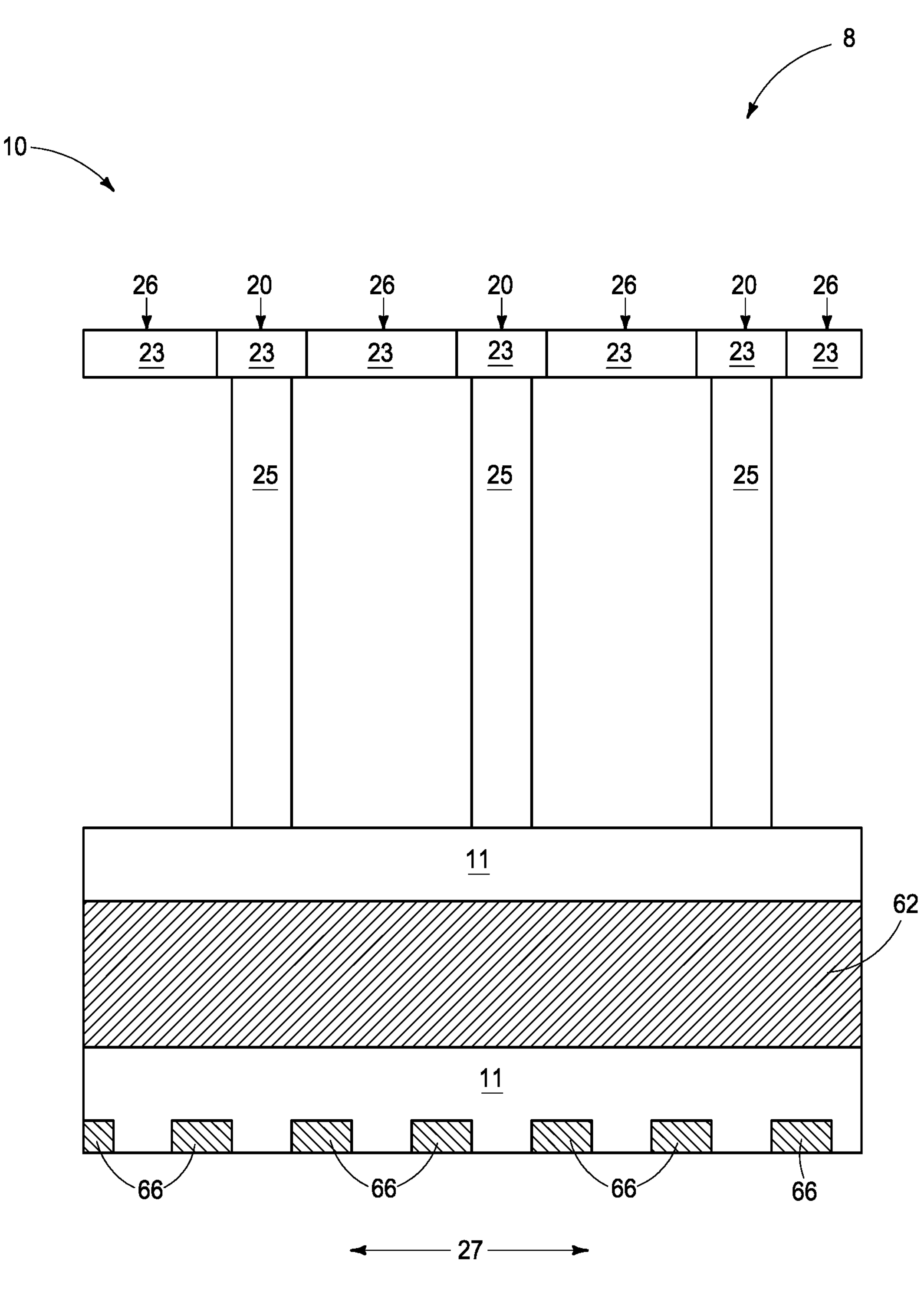

Referring to FIGS. 7-9, all of second material 25 that was directly under first material 23 in second walls 21 (no longer shown or so-designated) has been removed (e.g., by isotropic etching) to form beams 26 that are elongated along row direction 27 and are suspended between immediately-adjacent first walls 20, and to leave second material 25 directly under first material 23 in first walls 20. Beams 26 are individually between immediately-adjacent rows 44 (at least some of such rows) of top source/drain regions 13.

Figure 10:
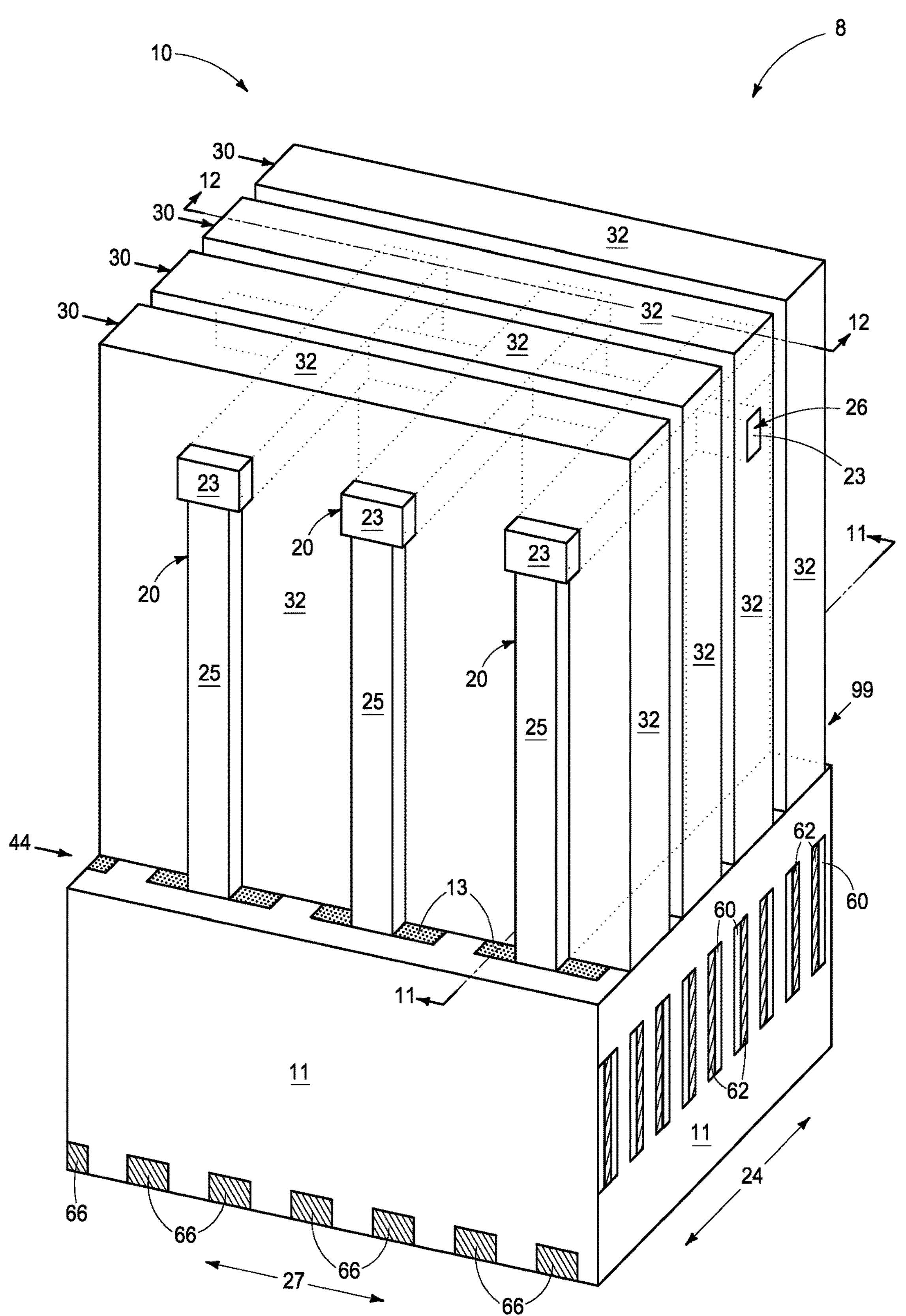
Figure 11:
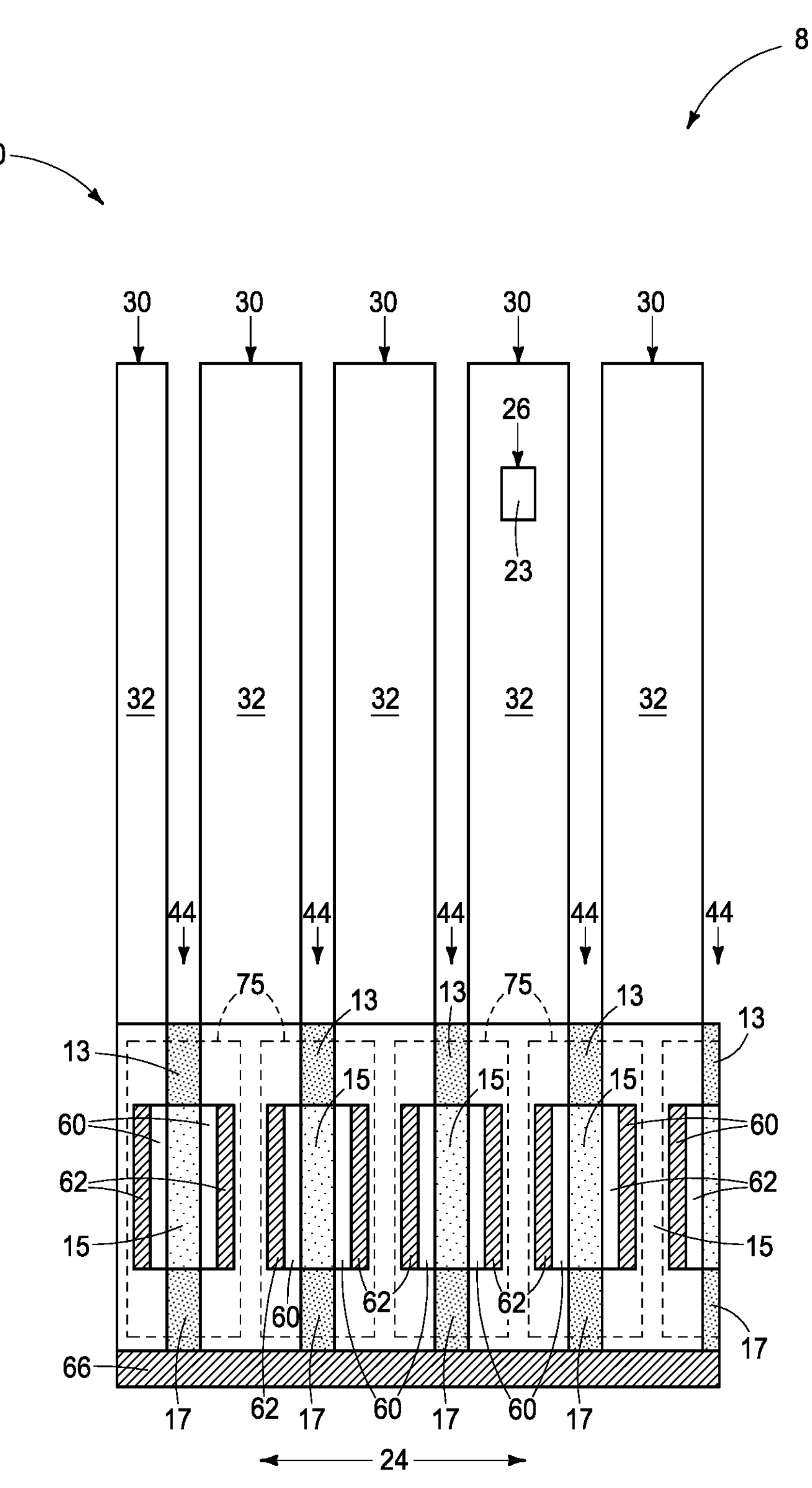
Figure 12:
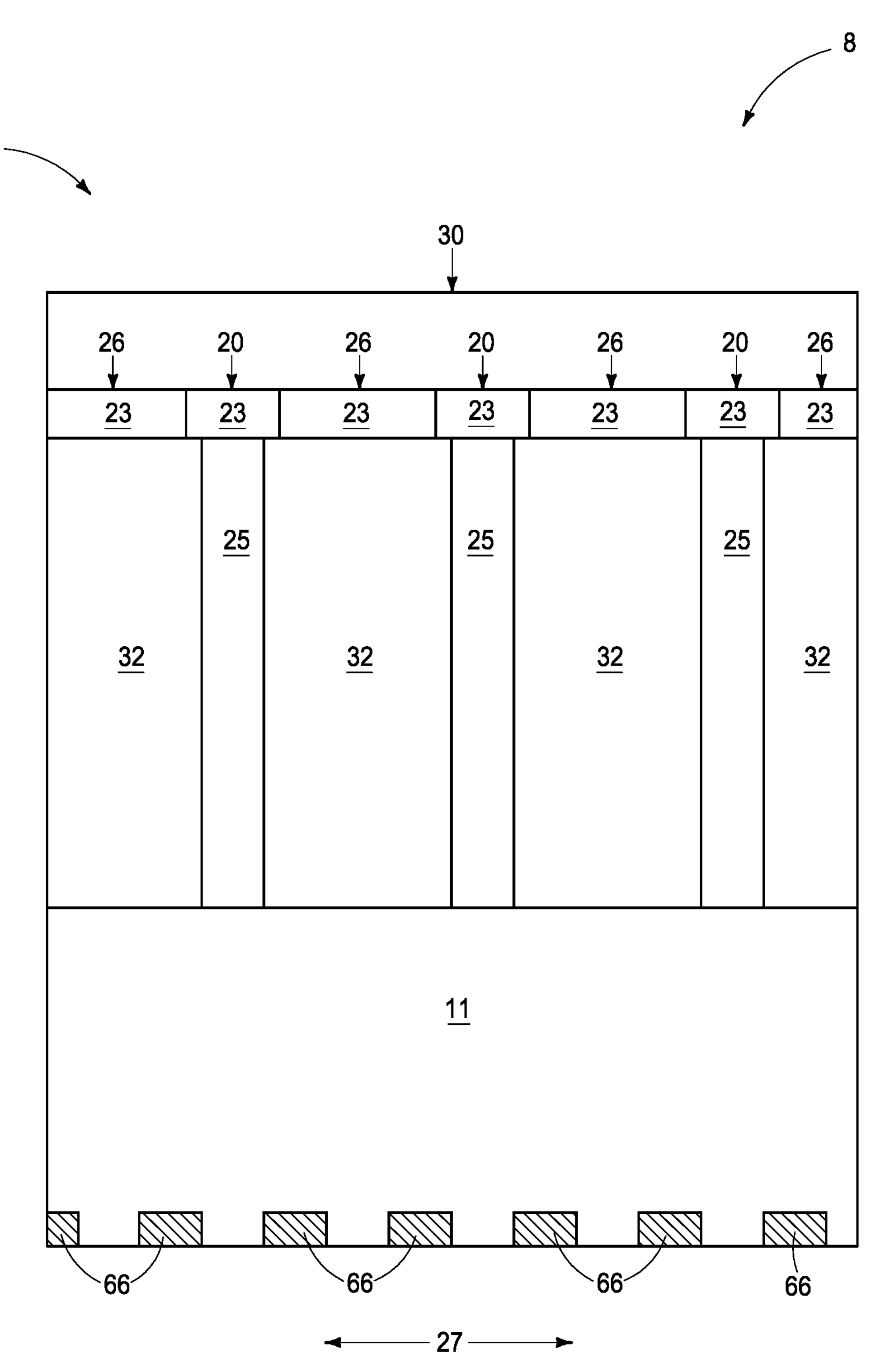

Referring to FIGS. 10-12, third walls 30 have been formed along row direction 27 and comprise third material 32 that is of different composition from those of first and second materials 23, 25. Third material 32 of individual third walls 30 circumferentially-covers beams 26. In one embodiment, third material 32 comprises carbon, for example at least one of elemental-form carbon, photoresist, and SiOC. In one embodiment, third material 32 comprises aluminum oxide. As shown in the example embodiment, individual third walls 30 are between immediately-adjacent rows 44 of top source/drain regions 13 (e.g., thereby upwardly-exposing same). A front third wall 30 that is covering over material 11 outside of top source/drain regions 13 along row direction 27 is not shown in FIG. 10 for clarity in such figure (but is shown in FIG. 11).

Figure 13:
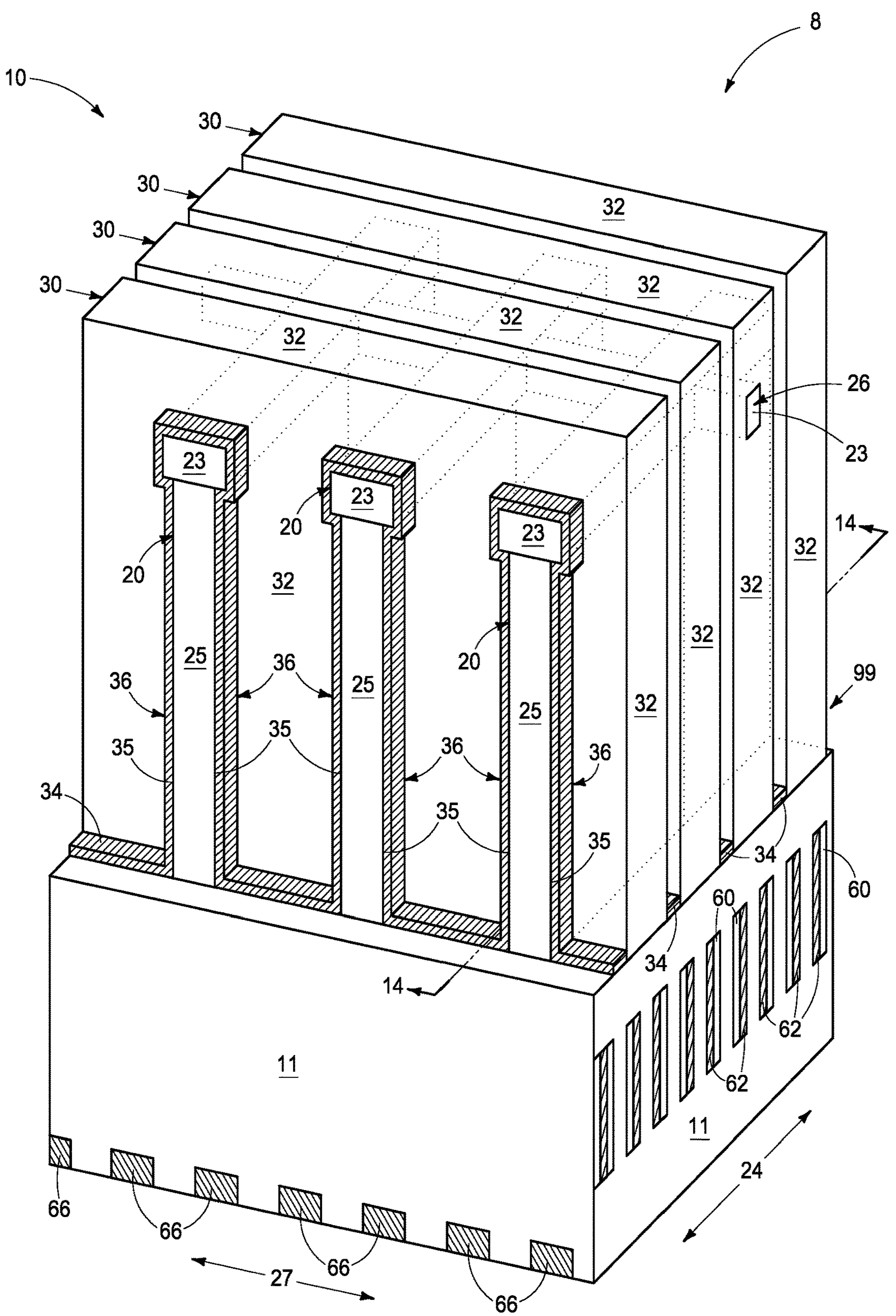
Figure 14:
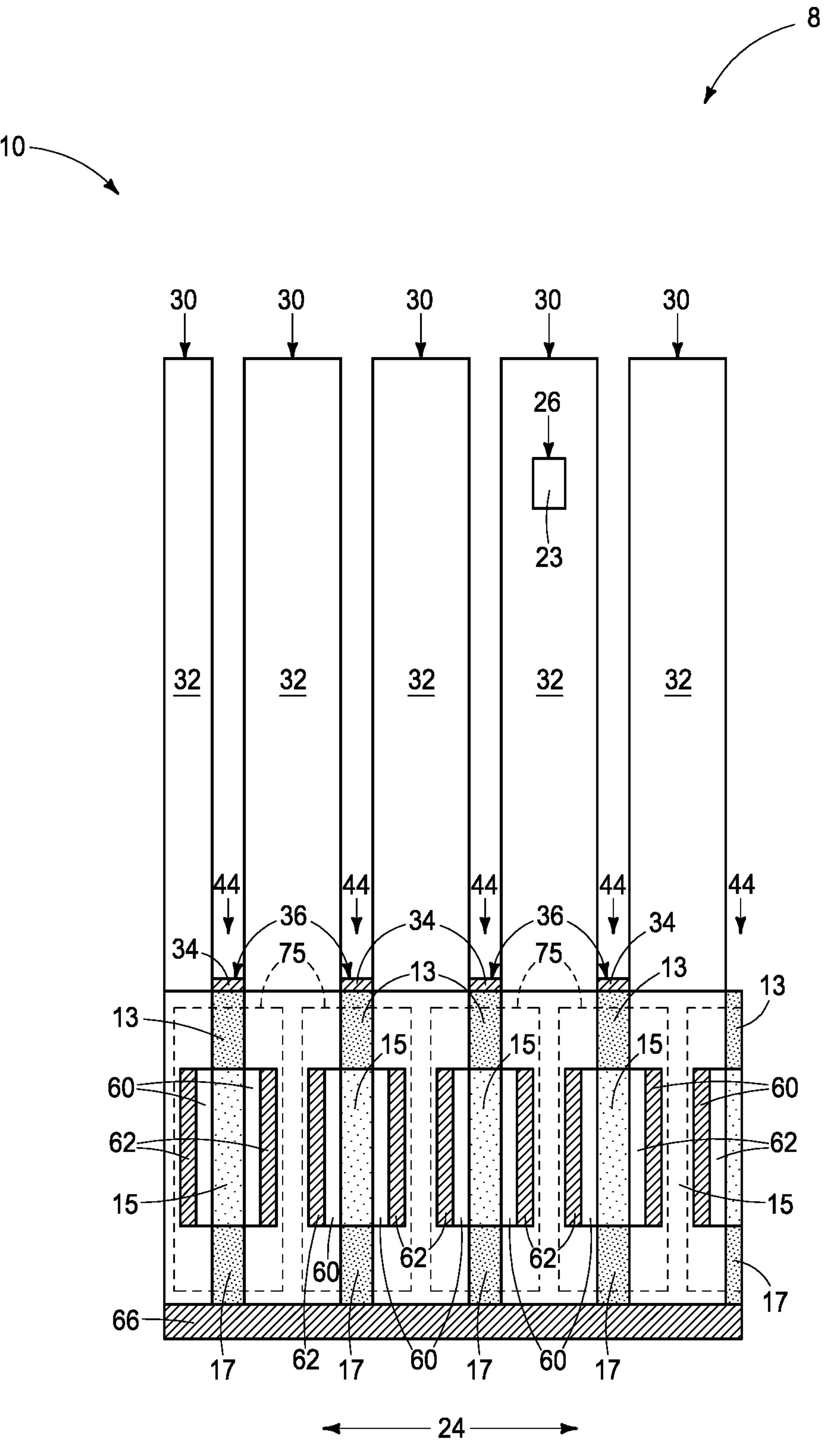
Figure 15:
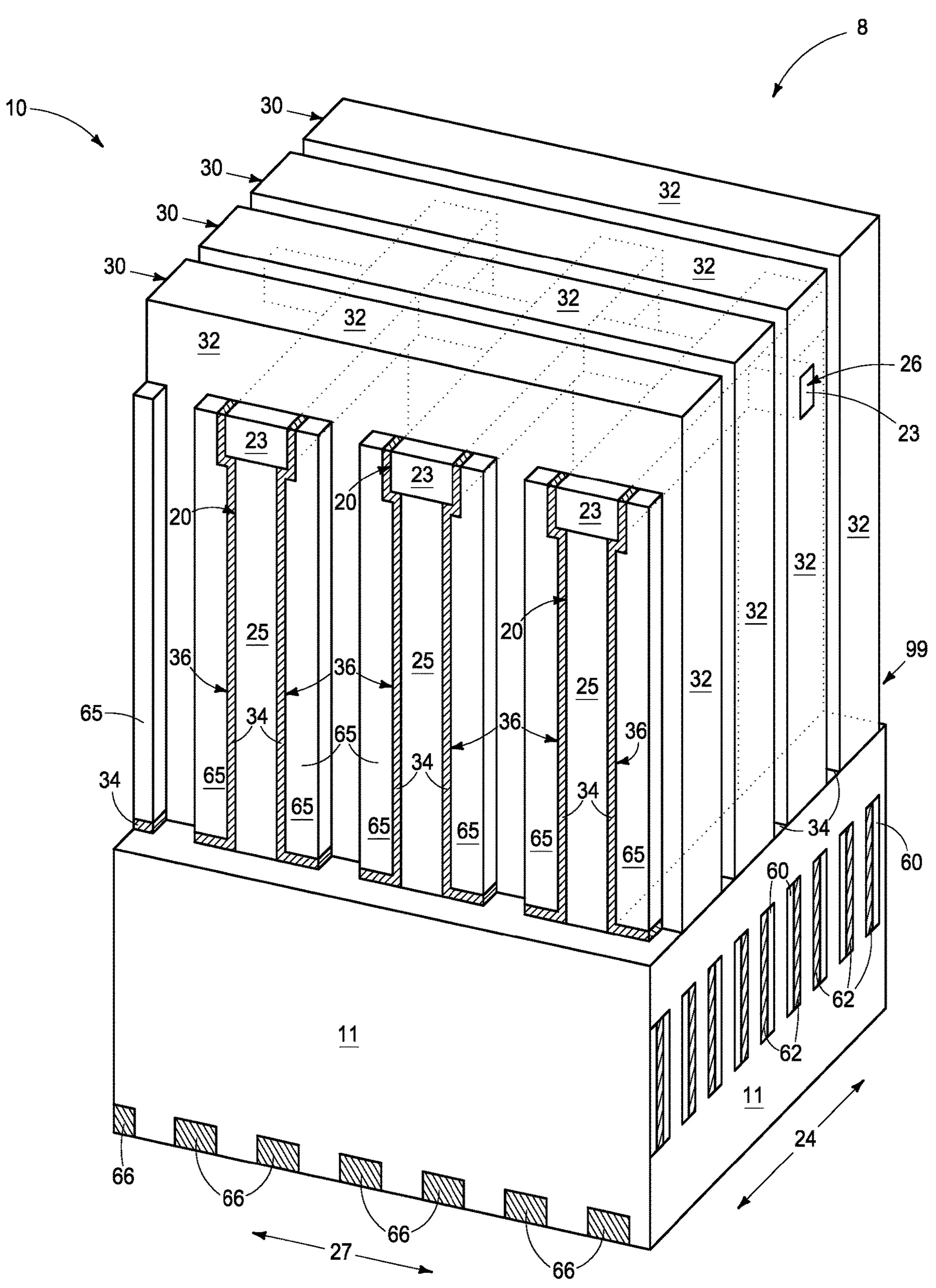

Referring to FIGS. 13 and 14, conductive material 34 has been selectively grown over first and second materials 23, 25 (and may so be from top source/drain region 13 material [e.g., conductively-doped silicon]) selectively relative to third material 32. Selectively-grown conductive material 34 is vertically along sidewalls 35 of first walls 20, is directly electrically coupled to top source/drain regions 13, and comprises first capacitor electrodes 36 of the capacitors being formed. FIG. 15 shows example subsequent processing where anisotropically-etched spacers 65 have been formed and used as an etch-mask while anisotropically etching conductive material 34 to remove such from shorting between immediately-adjacent first capacitor electrodes 36 along row direction 27.

The artisan is capable of selecting suitable third materials 32 upon which suitable conductive materials 34 will not deposit/grow, thereby being selectively grown/deposited over suitable first and second materials 23, 25 (e.g., and over material of source/drain region 13). Third material 32 may be intrinsically so-inhibited from such deposit/growth as-deposited or may be so-inhibited by treatment after deposit. For example, and by way of example only, amorphous carbon as third material 32 can be so-inhibited from growing/depositing TiN (an example conductive material 34; e.g., by ALD using $TiCl_4$ and $NH_3$ at 390° C.) by treatment with $H_2$ plasma after deposit.

Figure 16:
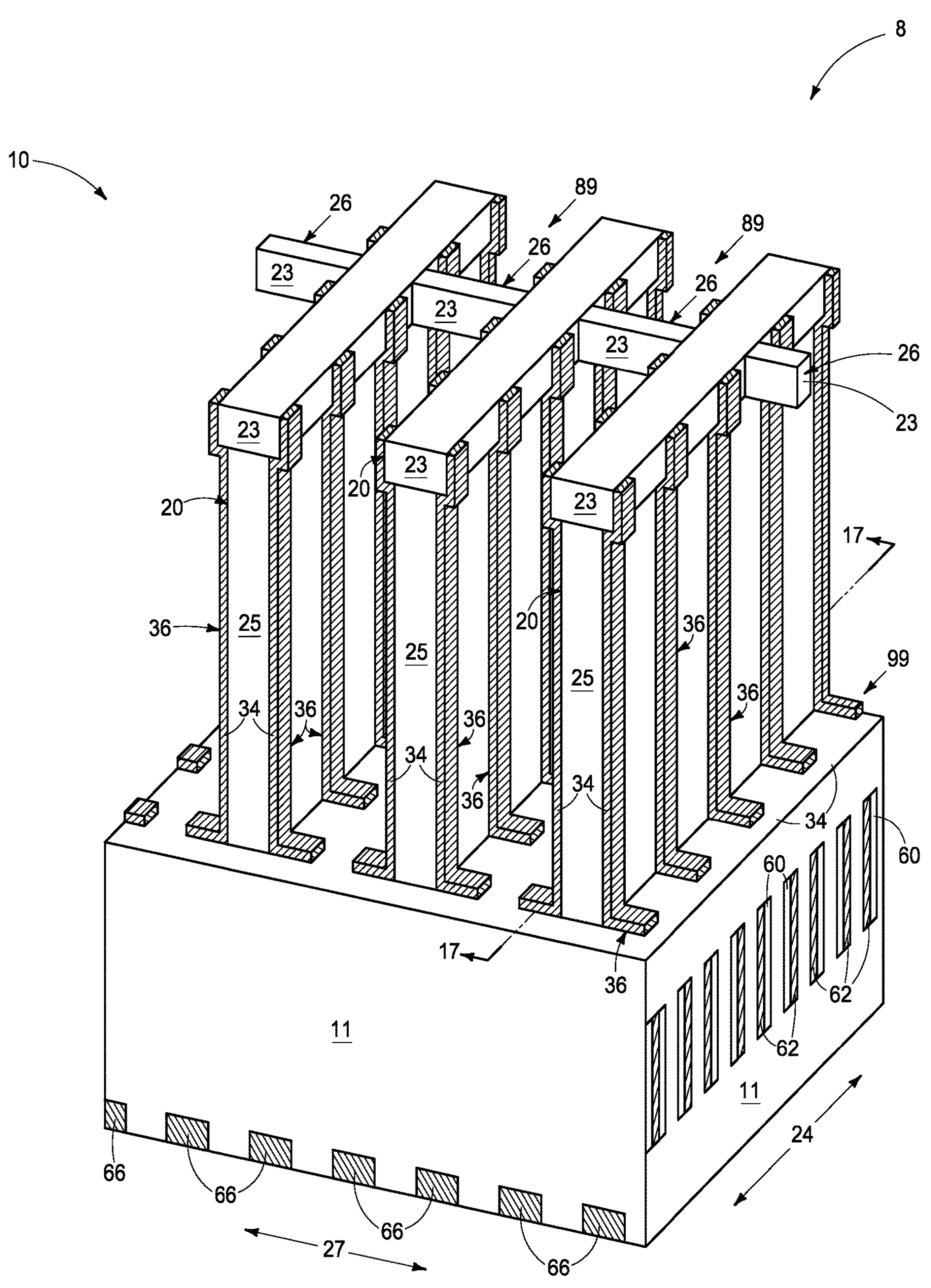
Figure 17:
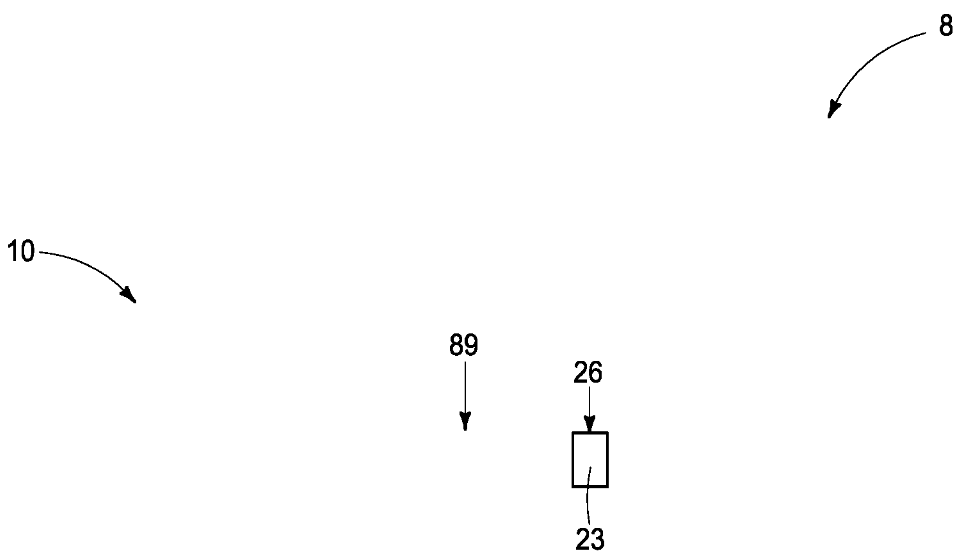
Figure 17:
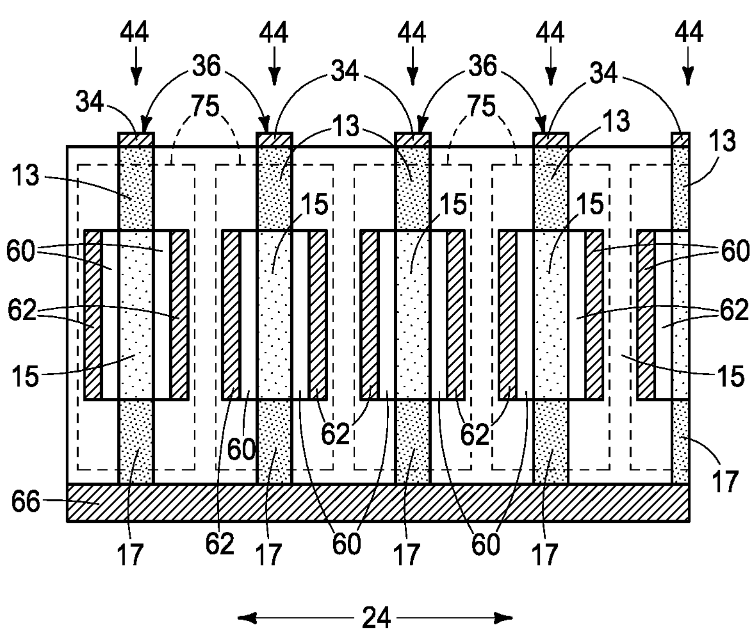

Referring to FIGS. 16 and 17, third walls 30 (not shown) and spacers 65 (when used and not shown) have been removed (e.g., by isotropic etchings) after forming selectively-grown conductive material 32. When used, spacers 65 and the etching of conductive material 34 therewith may occur after removing third walls 30.

Figure 18:
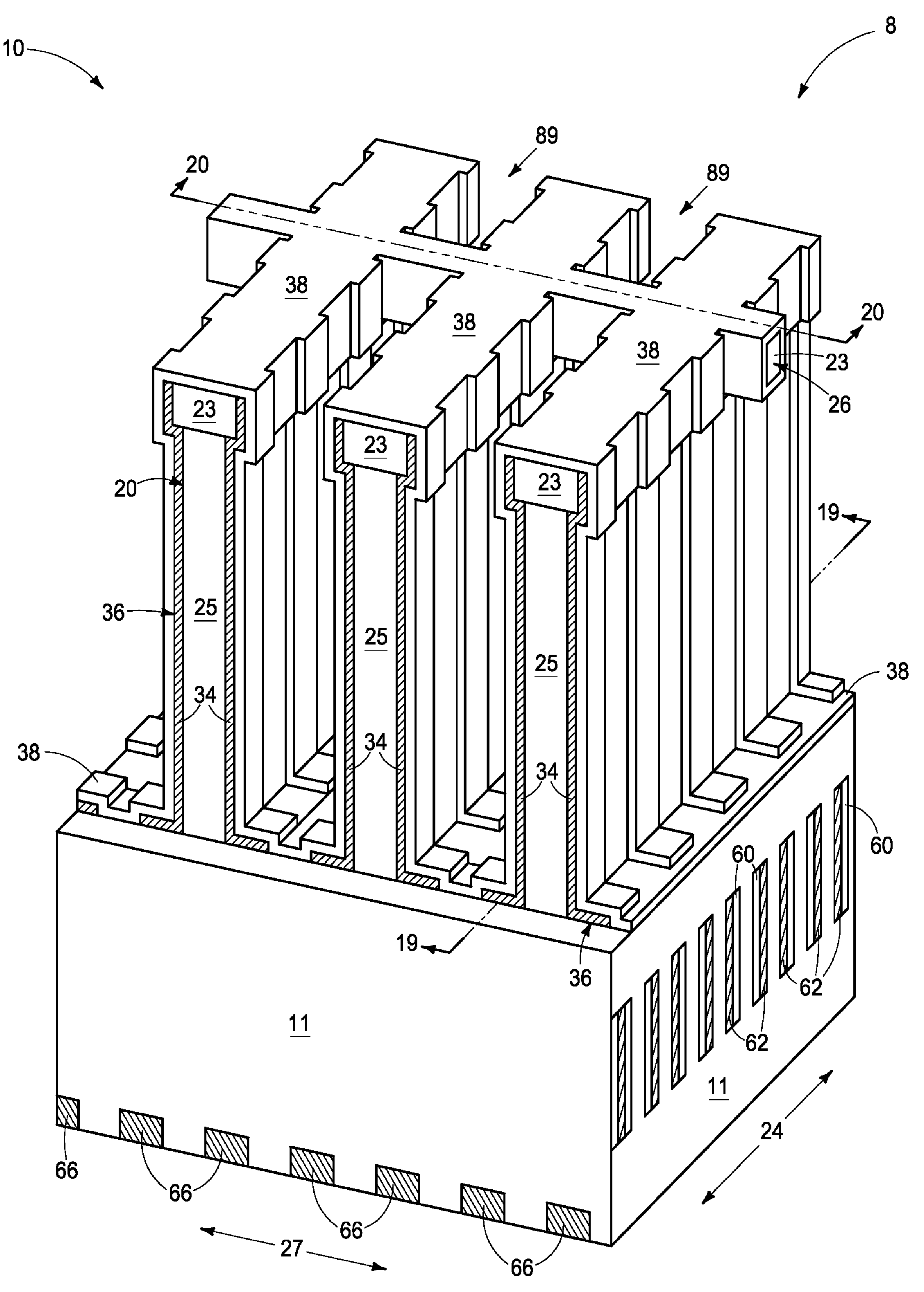
Figure 19:
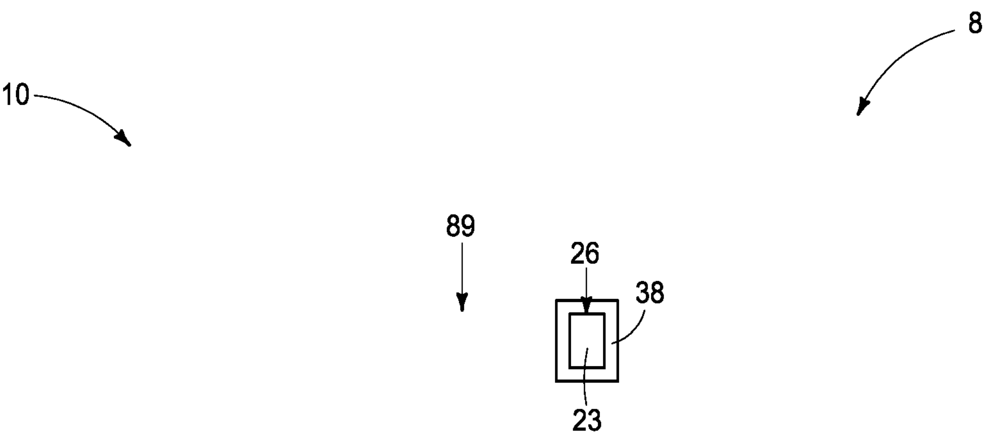
Figure 19:
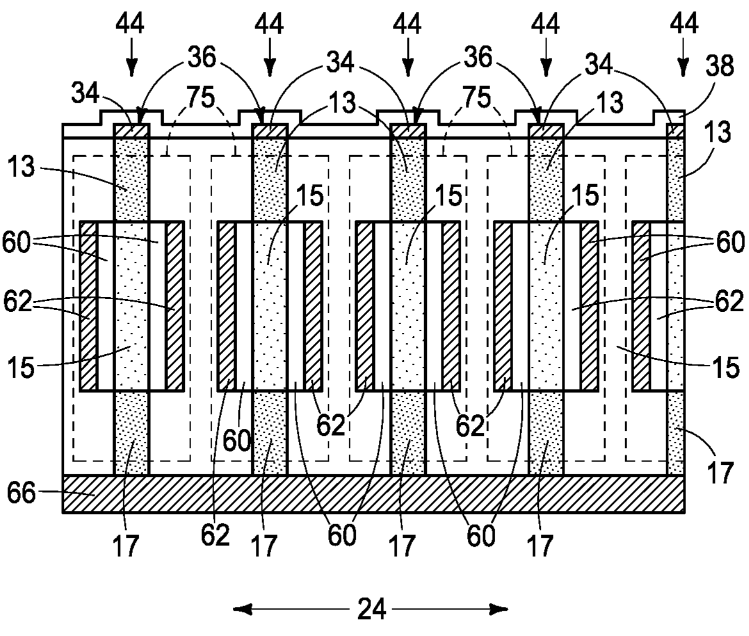
Figure 20:
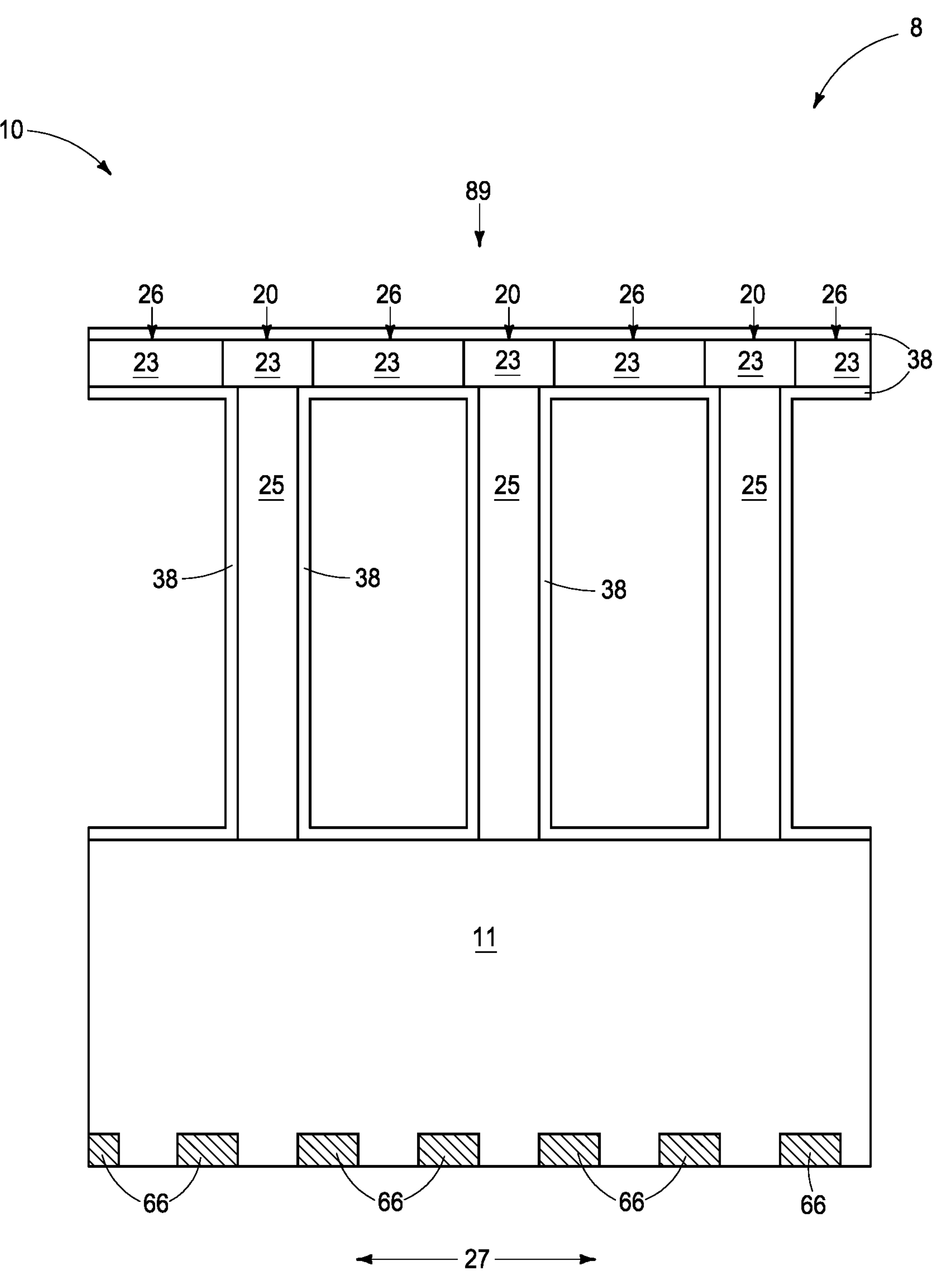

Referring to FIGS. 18-20, a capacitor insulator 38 has been formed over first capacitor electrodes 36 and that circumferentially-covers beams 26 (i.e., circumferentially-surrounds; i.e., is directly there-under, directly there-aside, and directly there-atop). Any suitable capacitor insulator may be used (e.g., including ferroelectric material).

Figure 21:
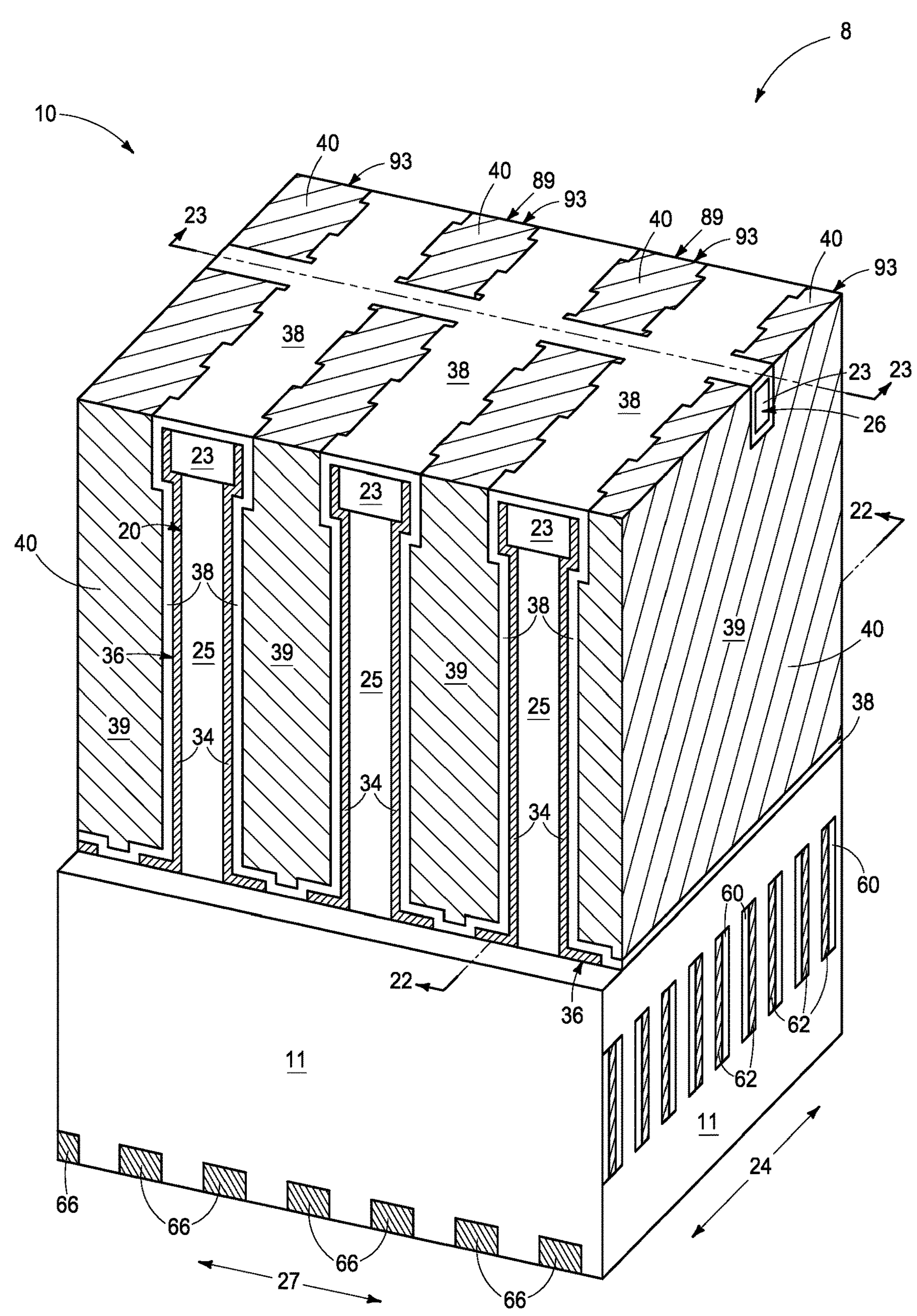
Figure 22:
Figure 22:
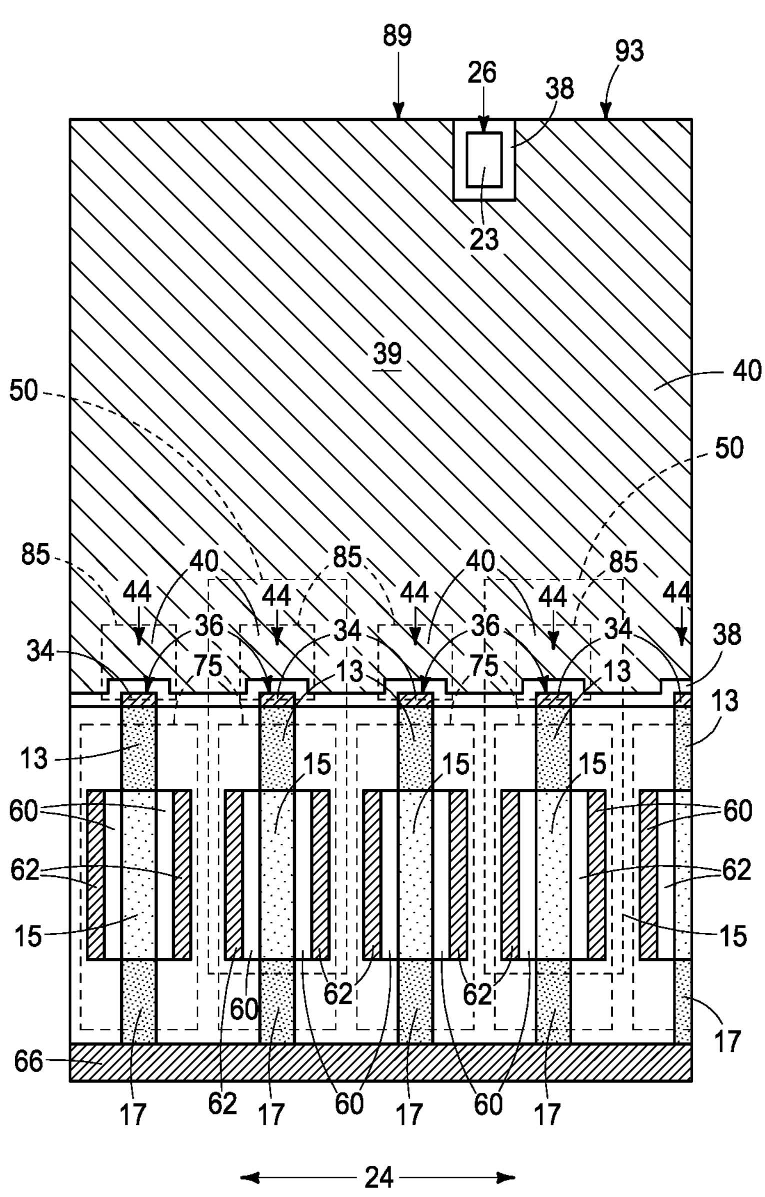
Figure 23:
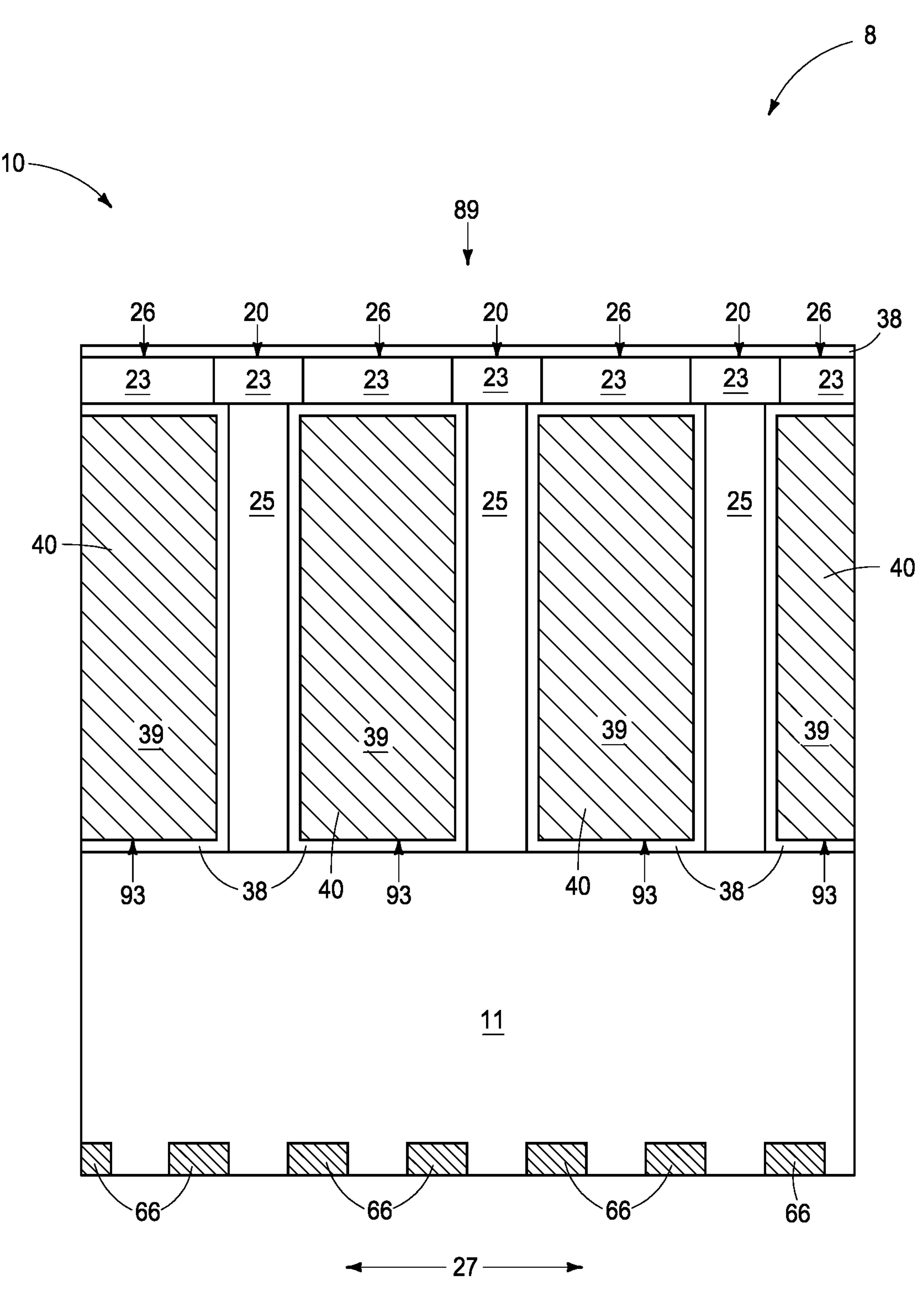

Referring to FIGS. 21-23, conductive material 39 has been formed over capacitor insulator 38 to comprise second capacitor electrodes 40. Thereby, a plurality of capacitors 85 has been formed (FIG. 22) that individually comprise one of first capacitor electrodes 36, capacitor insulator 38, and one of second capacitor electrodes 40, with second capacitor electrodes 40 being common to multiple of capacitors 85 (i.e., common to some such capacitors, not necessarily all such capacitors, within array 10). Thereby, example individual memory cells 50 have been formed which individually comprise one of vertical transistors 75 and one of capacitors 85. Conductive material 39 may be deposited to overfill trenches 89 followed by planarizing such back at least to the top of capacitor insulator 38, thereby forming lines 93 of conductive material 39. Multiple conductive-material lines 93 may be directly electrically coupled together (not shown) to form one or more common second capacitor electrodes 40.

Any other attribute(s) or aspect(s) as shown and/or described herein with respect to other embodiments may be used in the embodiments shown and described with reference to the above embodiments.

Subsequent processing may of course be conducted. For example, FIGS. 18-20 show an example embodiment where capacitor insulator 38 has been formed atop first walls 20.

Figure 24:
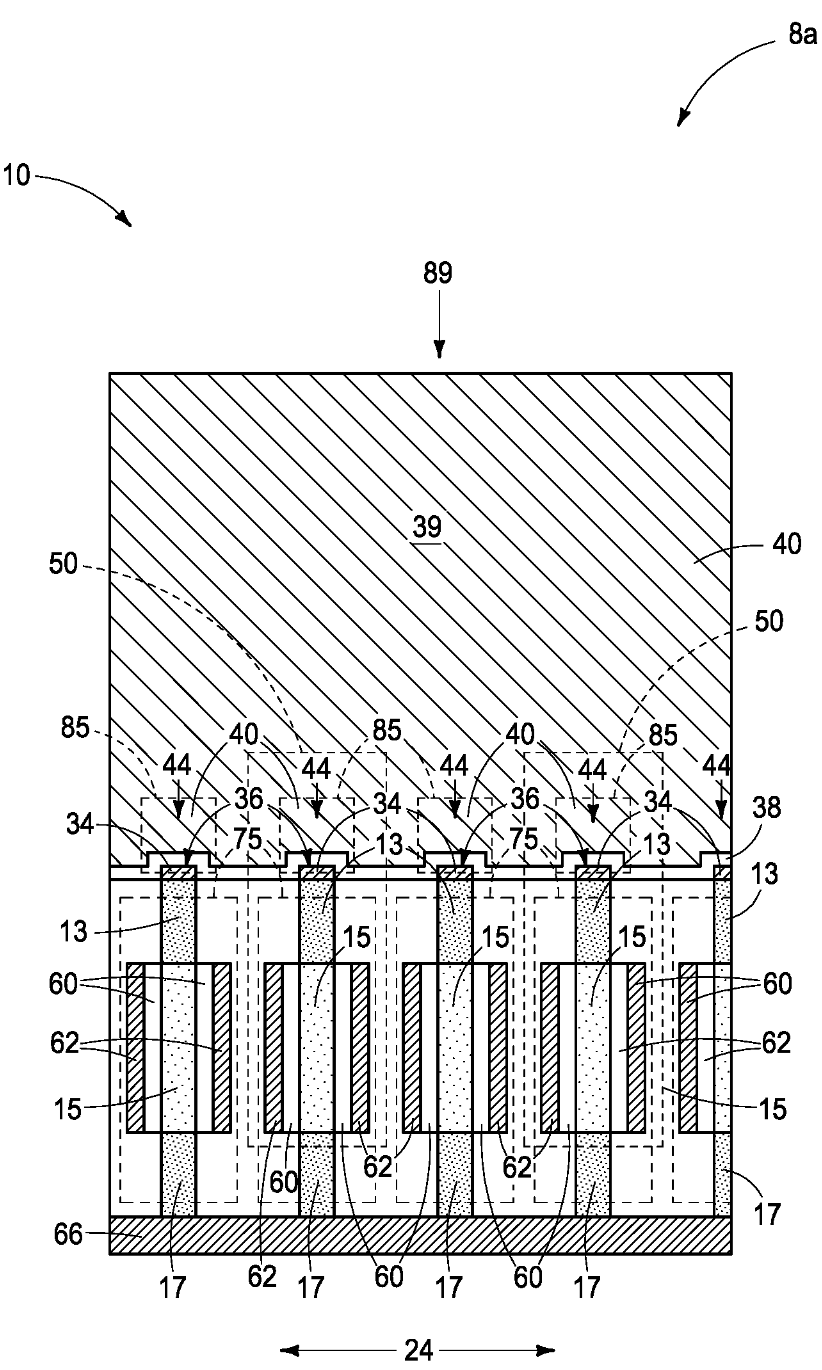
Figure 25:
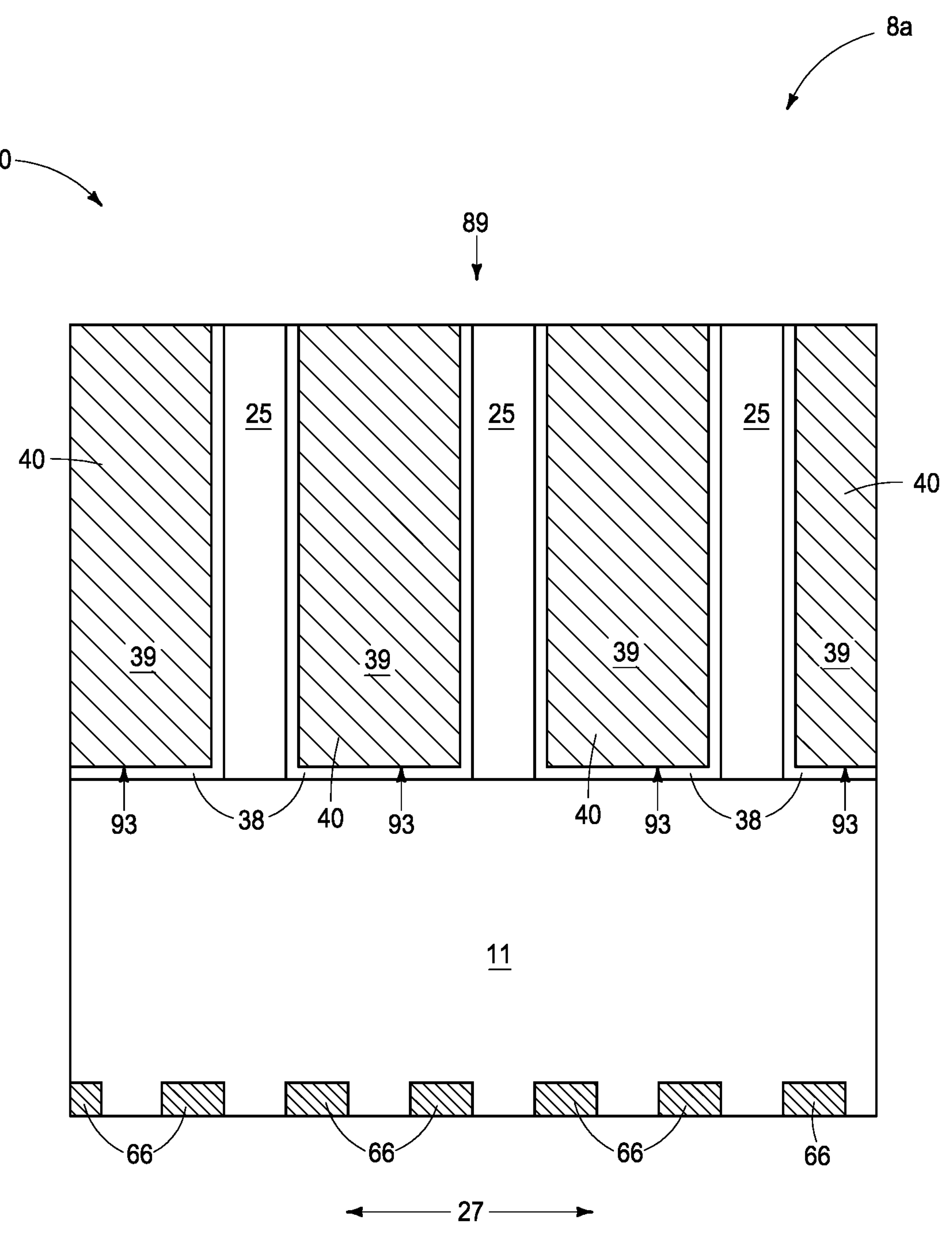
Figure 26:
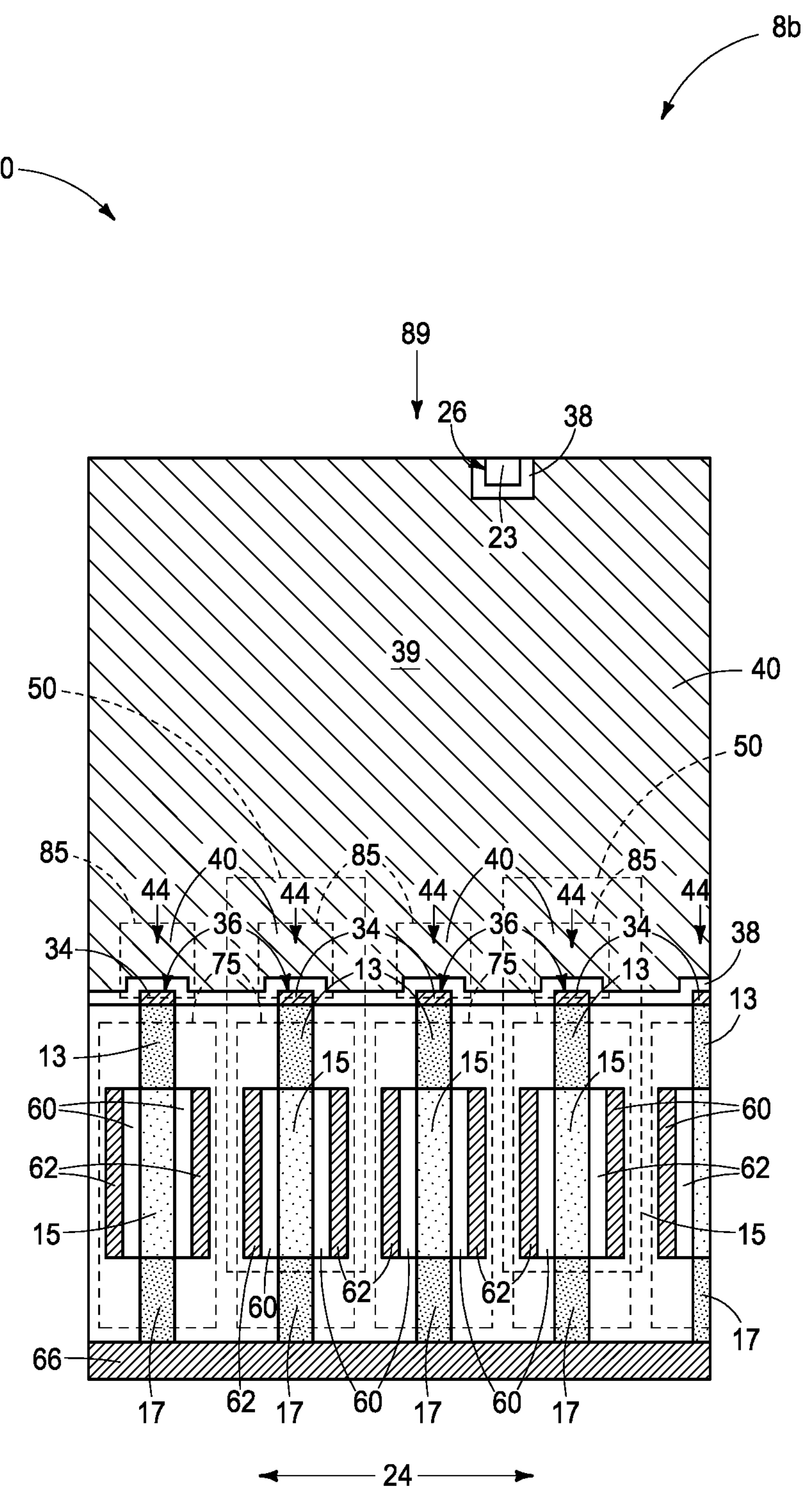
Figure 27:
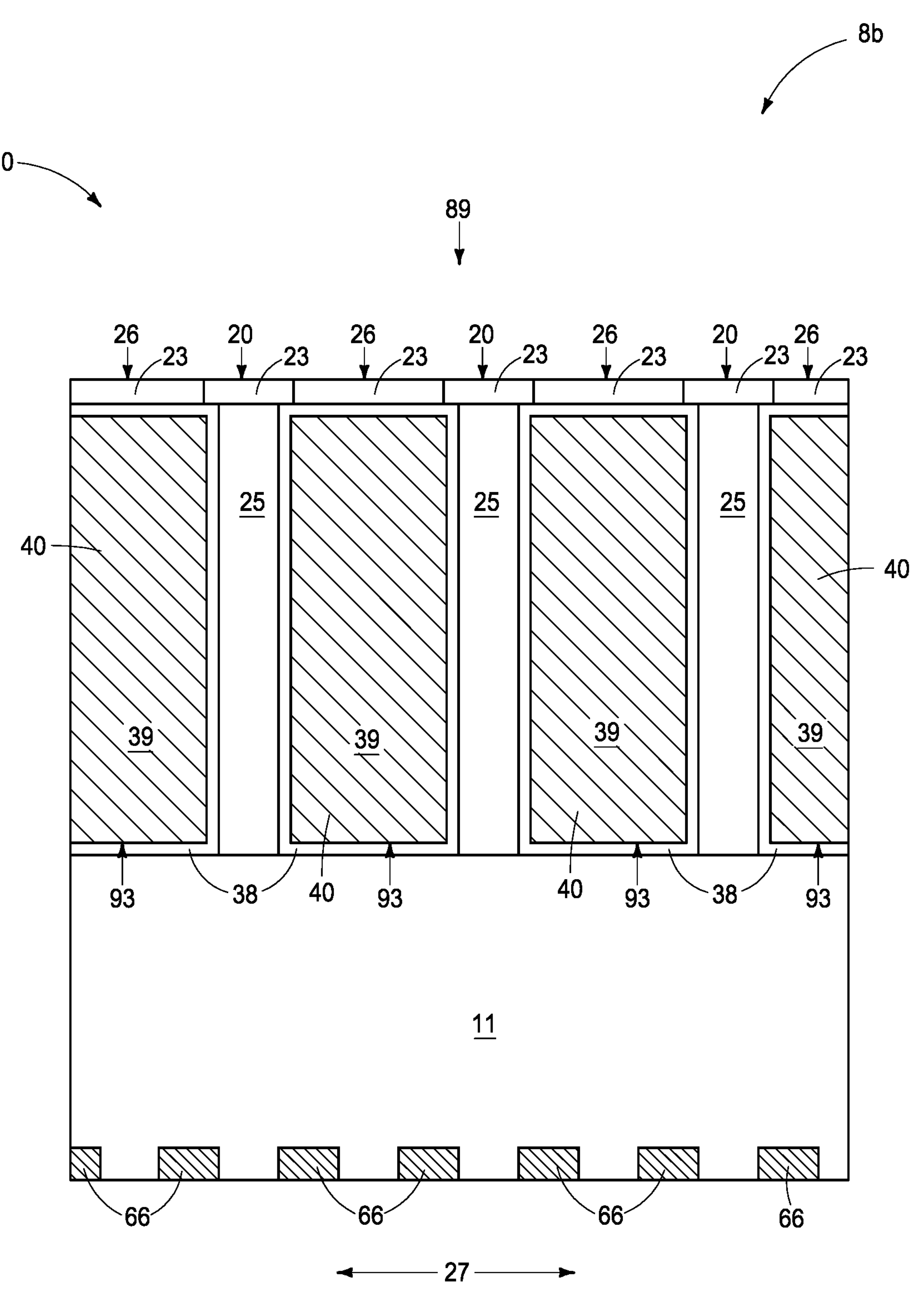
Figure 28:
Figure 28:
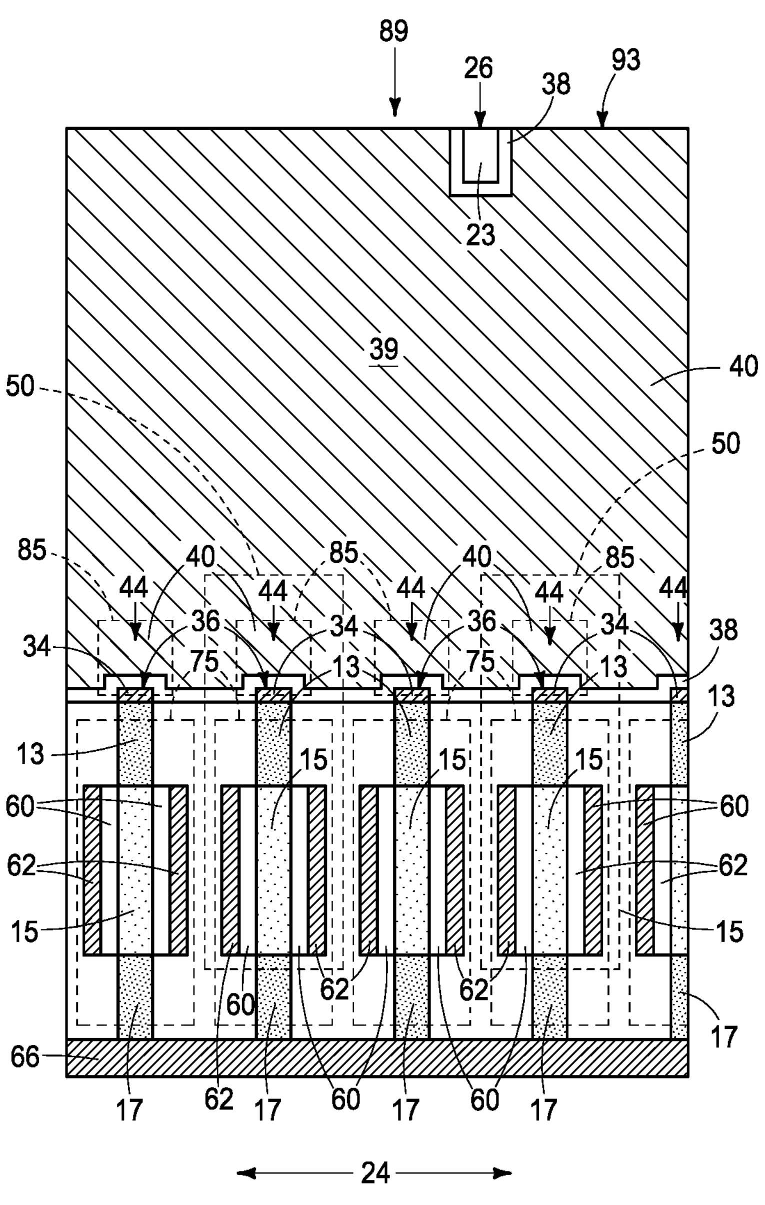
Figure 29:
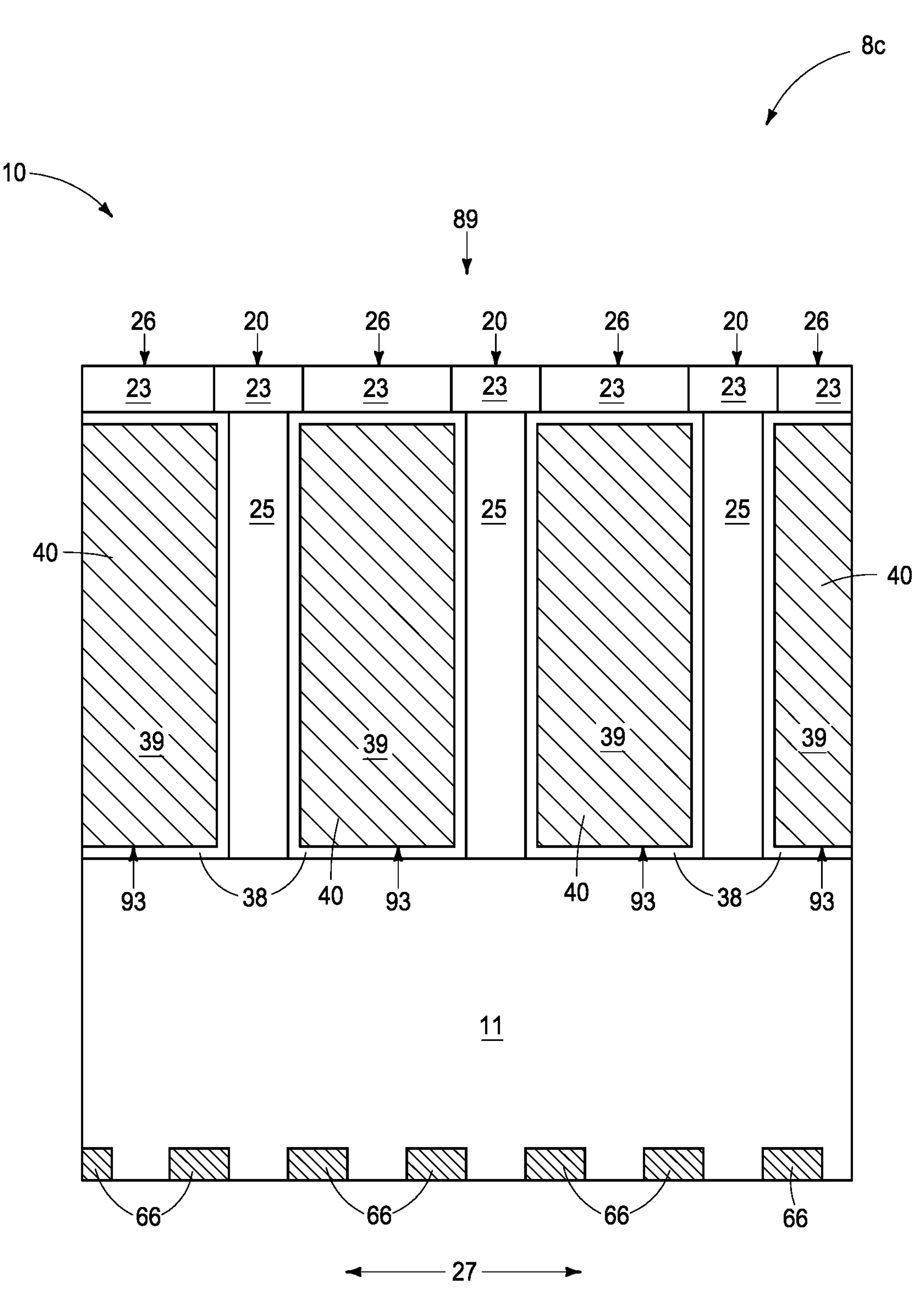

FIGS. 24 and 25 show removing such capacitor insulator 38 from being atop first walls 20, removing first material 23 (not shown) from being atop first walls 20, and removing of beams 26 (not shown), thus forming a construction 8*a*. Like numerals from the above-described embodiments have been used where appropriate, with some construction differences being indicated with the suffix "a". Alternately, and by way of example, not all of individual beams 26 may be removed, for example as shown with respect to FIGS. 26/27 and 28/29 showing constructions 8*b* and 8*c*, respectively. Like numerals from the above-described embodiments have been used where appropriate, with some construction differences being indicated with the suffixes "b" and "c", respectively. Constructions 8, 8*b*, and 8*c* show examples where beams 26 have capacitor insulator 38 directly there-under remaining in a finished-circuitry construction encompassing array 10 of memory cells 50. Constructions 8, 8*b*, and 8*c* show examples where beams 26 have capacitor insulator 38 directly there-under and directly there-aside remaining in the finished-circuitry construction. Further, construction 8 shows an example embodiment where beams 26 have capacitor insulator 38 directly there-under, directly there-aside, and directly there-atop remaining in the finished circuitry construction. Any other attribute(s) or aspect(s) as shown and/or described herein with respect to other embodiments may be used.

In one embodiment, a method used in forming an array (e.g., 10) of capacitors (e.g., 85) comprises forming first walls (e.g., 20) along a column direction (e.g., 24) and second walls (e.g., 21) along a row direction (e.g., 27). The first and second walls individually comprise a first material (e.g., 23) directly above a second material (e.g., 25), with the first and second materials being of different compositions relative one another. All of the second material is removed from being directly under the first material in the second walls to form beams (e.g., 26) that are elongated along the row direction and are suspended between immediately-adjacent of the first walls and to leave the second material directly under the first material in the first walls. Third walls (e.g., 30) are formed along the row direction. The third walls comprise third material (e.g., 32) that is of different composition from those of the first and second materials. The third material of individual of the third walls circumferentially-covers the beams. Conductive material (e.g., 34) is grown over the first and second materials selectively relative to the third material. The selectively-grown conductive material is vertically-along sidewalls (e.g., 35) of the first walls and comprises first capacitor electrodes (e.g., 36). The third walls are removed after the selectively growing. After doing so, a capacitor insulator (e.g., 38) is formed over the first capacitor electrodes and that circumferentially-covers the beams. Second capacitor electrodes (e.g., 40) are formed over the capacitor insulator to form a plurality of capacitors (e.g., 85) that individually comprise one of the first capacitor electrodes, the capacitor insulator, and one of the second capacitor electrodes, with the second capacitor electrodes being common to multiple of the capacitors. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 10) of memory cells (e.g., 50) comprises a plurality of vertical transistors (e.g., 75) in rows (e.g., 44) along a row direction (e.g., 27) and in columns (e.g., 99) along a column direction (e.g., 24). The vertical transistors individually comprise a top source/drain region (e.g., 13), a bottom source/drain region (e.g., 17), and a channel region (e.g., 15) vertically there-between. A plurality of gate lines (e.g., 62) is included, with the gate lines individually being operatively laterally-proximate the channel regions along individual of the rows. A plurality of digitlines (e.g., 66) is below the gate lines and are individually directly electrically coupled to the bottom source/drain regions along individual of the columns. First walls (e.g., 20) are along the column direction and individually comprise a first material (e.g., 23) directly above a second material (e.g., 25), with the first and second materials being of different compositions relative one another. A plurality of capacitors (e.g., 85) is included, with the capacitors individually comprising a first capacitor electrode (e.g., 36), a capacitor insulator (e.g., 38), and a second capacitor electrode (e.g., 40), with individual of the first capacitor electrodes being directly electrically coupled to individual of the top source/drain regions. The array includes beams (e.g., 26) that are elongated along the row direction between immediately-adjacent of the first walls. The beams individually comprising the first material that joins with the first material of the immediately-adjacent first walls and the capacitor insulator is directly under and directly against the beams. Any other attribute(s) or aspect(s) as shown and/or described herein with respect to other embodiments may be used.

In one embodiment, an array (e.g., 10) of capacitors (e.g., 85) comprises a plurality of capacitors (e.g., 85) in rows (e.g., 44) along a row direction (e.g., 27) and in columns (e.g., 99) along a column direction (e.g., 24). The capacitors individually comprise a first capacitor electrode (e.g., 36), a capacitor insulator (e.g., 38), and a second capacitor electrode (e.g., 40). First walls (e.g., 20) are along the column direction and individually comprise a first material (e.g., 23) directly above a second material (e.g., 25), with the first and second materials being of different compositions relative one another. Beams (e.g., 26) are included and that are elongated along the row direction between immediately-adjacent of the first walls. The beams individually comprise the first material that joins with the first material of the immediately-adjacent first walls and the capacitor insulator is directly under and directly against the beams. Any other attribute(s) or aspect(s) as shown and/or described herein with respect to other embodiments may be used.

Heretofore, to prevent material of first capacitor electrodes 36 from shorting between immediately column-adjacent capacitors 85, insulator dummy structures were formed below lattice-like support beams. Such may not be used or needed in accordance with some method aspects of the invention.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming an array of memory cells comprises forming a plurality of vertical transistors in rows along a row direction and in columns along a column direction. The vertical transistors individually comprise a top source/drain region, a bottom source/drain region, and a channel region vertically there-between. A plurality of gate lines is individually operatively laterally-proximate the channel regions along individual of the rows. A plurality of digitlines is below the gate lines and are individually directly electrically coupled to the bottom source/drain regions along individual of the columns. First walls are formed along the column direction and second walls along the row direction. The first and second walls individually comprise a first material directly above a second material. The first and second materials are of different compositions relative one another. All of the second material is removed from being directly under the first material in the second walls to form beams that are elongated along the row direction and are suspended between immediately-adjacent of the first walls and to leave the second material directly under the first material in the first walls. The beams individually are between immediately-adjacent rows of the top source/drain regions. Third walls are formed along the row direction. The third walls comprise third material that is of different composition from those of the first and second materials. The third material of individual of the third walls circumferentially-covers the beams. Conductive material is grown over the first and second materials selectively relative to the third material. The selectively-grown conductive material is vertically along sidewalls of the first walls, directly electrically coupled to the top source/drain regions, and comprises first capacitor electrodes. The third walls are removed after the selectively growing. After removing the third walls, a capacitor insulator is formed over the first capacitor electrodes and that circumferentially-covers the beams. Second capacitor electrodes are formed over the capacitor insulator to form a plurality of capacitors that individually comprise one of the first capacitor electrodes, the capacitor insulator, and one of the second capacitor electrodes. The second capacitor electrodes are common to multiple of the capacitors.

In some embodiments, a method used in forming an array of capacitors comprises forming first walls along a column direction and second walls along a row direction. The first and second walls individually comprise a first material directly above a second material. The first and second materials are of different compositions relative one another. All of the second material is removed from being directly under the first material in the second walls to form beams that are elongated along the row direction and are suspended between immediately-adjacent of the first walls and to leave the second material directly under the first material in the first walls. Third walls are formed along the row direction. The third walls comprise third material that is of different composition from those of the first and second materials. The third material of individual of the third walls circumferentially-covers the beams. Conductive material is grown over the first and second materials selectively relative to the third material. The selectively-grown conductive material is vertically-along sidewalls of the first walls and comprising first capacitor electrodes. The third walls are removed after the selectively growing. After removing the third walls, a capacitor insulator is formed over the first capacitor electrodes and that circumferentially-covers the beams. Second capacitor electrodes are formed over the capacitor insulator to form a plurality of capacitors that individually comprise one of the first capacitor electrodes, the capacitor insulator, and one of the second capacitor electrodes. The second capacitor electrodes are common to multiple of the capacitors.

In some embodiments, an array of memory cells comprises a plurality of vertical transistors in rows along a row direction and in columns along a column direction. The vertical transistors individually comprise a top source/drain region, a bottom source/drain region, and a channel region vertically there-between. A plurality of gate lines is individually operatively laterally-proximate the channel regions along individual of the rows. A plurality of digitlines is below the gate lines and that are individually directly electrically coupled to the bottom source/drain regions along individual of the columns. First walls are along the column direction. The first walls individually comprise a first material directly above a second material. The first and second materials are of different compositions relative one another. A plurality of capacitors are included and that individually comprise a first capacitor electrode, a capacitor insulator, and a second capacitor electrode. Individual of the first capacitor electrodes are directly electrically coupled to individual of the top source/drain regions. Beams are elongated along the row direction between immediately-adjacent of the first walls. The beams individually comprise the first material that joins with the first material of the immediately-adjacent first walls. The capacitor insulator is directly under and directly against the beams.

In some embodiments, an array of capacitors comprises a plurality of capacitors in rows along a row direction and in columns along a column direction. The capacitors individually comprise a first capacitor electrode, a capacitor insulator, and a second capacitor electrode. First walls are along the column direction. The first walls individually comprise a first material directly above a second material. The first and second materials are of different compositions relative one another. Beams are elongated along the row direction between immediately-adjacent of the first walls. The beams individually comprise the first material that joins with the first material of the immediately-adjacent first walls. The capacitor insulator is directly under and directly against the beams.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of memory cells, comprising:

forming a plurality of vertical transistors in rows along a row direction and in columns along a column direction; the vertical transistors individually comprising a top source/drain region, a bottom source/drain region, and a channel region vertically there-between; a plurality of gate lines being individually operatively laterally-proximate the channel regions along individual of the rows, a plurality of digitlines being below the gate lines and that are individually directly electrically coupled to the bottom source/drain regions along individual of the columns;

forming first walls along the column direction and second walls along the row direction, the first and second walls individually comprising a first material directly above a second material, the first and second materials being of different compositions relative one another;

removing all of the second material from being directly under the first material in the second walls to form beams that are elongated along the row direction and are suspended between immediately-adjacent of the first walls and to leave the second material directly under the first material in the first walls, the beams individually being between immediately-adjacent rows of the top source/drain regions;

forming third walls along the row direction, the third walls comprising third material that is of different composition from those of the first and second materials, the third material of individual of the third walls circumferentially-covering the beams;

growing conductive material over the first and second materials selectively relative to the third material; the selectively-grown conductive material being vertically along sidewalls of the first walls, directly electrically coupled to the top source/drain regions, and comprising first capacitor electrodes;

removing the third walls after the selectively growing;

after removing the third walls, forming a capacitor insulator over the first capacitor electrodes and that circumferentially-covers the beams; and forming second capacitor electrodes over the capacitor insulator to form a plurality of capacitors that individually comprise one of the first capacitor electrodes, the capacitor insulator, and one of the second capacitor electrodes; the second capacitor electrodes being common to multiple of the capacitors.

2. The method of claim 1 wherein the first material comprises silicon nitride, the second material comprises silicon dioxide, and the third material comprises carbon.

3. The method of claim 1 wherein the first material comprises silicon nitride, the second material comprises silicon dioxide, and the third material comprises aluminum oxide.

4. The method of claim 1 wherein the beams having the capacitor insulator directly there-under remain in a finished-circuitry construction encompassing the array of memory cells.

5. An array of memory cells, comprising:

a plurality of vertical transistors in rows along a row direction and in columns along a column direction; the vertical transistors individually comprising a top source/drain region, a bottom source/drain region, and a channel region vertically there-between; a plurality of gate lines being individually operatively laterally-proximate the channel regions along individual of the rows, a plurality of digitlines being below the gate lines and that are individually directly electrically coupled to the bottom source/drain regions along individual of the columns;

first walls along the column direction, the first walls individually comprising a first material directly above a second material, the first and second materials being of different compositions relative one another;

a plurality of capacitors that individually comprise a first capacitor electrode, a capacitor insulator, and a second capacitor electrode; individual of the first capacitor electrodes being directly electrically coupled to individual of the top source/drain regions; and beams that are elongated along the row direction between immediately-adjacent of the first walls, the beams individually comprising the first material that joins with the first material of the immediately-adjacent first walls, the capacitor insulator being directly under and directly against the beams.

6. The array of claim 5 wherein individual of the first walls are between immediately-adjacent columns of the top source/drain regions.

7. The array of claim 5 wherein the capacitor insulator is directly against opposing sides of the beams.

8. The array of claim 7 wherein the capacitor insulator is directly against a top of the beams.

9. The array of claim 7 wherein the first material is insulative.

10. The array of claim 7 wherein the second material is insulative.

11. The array of claim 7 wherein the first and second materials are insulative.

12. The array of claim 11 wherein the first material comprises silicon nitride and the second material comprises silicon dioxide.

13. The array of claim 7 wherein the first capacitor electrodes comprise TiN.

14. An array of capacitors, comprising:

a plurality of capacitors in rows along a row direction and in columns along a column direction; the capacitors individually comprising a first capacitor electrode, a capacitor insulator, and a second capacitor electrode;

first walls along the column direction, the first walls individually comprising a first material directly above a second material, the first and second materials being of different compositions relative one another; and beams that are elongated along the row direction between immediately-adjacent of the first walls, the beams individually comprising the first material that joins with the first material of the immediately-adjacent first walls, the capacitor insulator being directly under and directly against the beams.

15. The array of claim 14 wherein the capacitor insulator is directly against opposing sides of the beams.

16. The array of claim 15 wherein the capacitor insulator is directly against a top of the beams.

17. The array of claim 14 wherein the first material is insulative.

18. The array of claim 14 wherein the second material is insulative.

19. The array of claim 14 wherein the first and second materials are insulative.

20. The array of claim 19 wherein the first material comprises silicon nitride and the second material comprises silicon dioxide.

21. A method used in forming an array of capacitors, comprising:

forming first walls along a column direction and second walls along a row direction, the first and second walls individually comprising a first material directly above a second material, the first and second materials being of different compositions relative one another;

removing all of the second material from being directly under the first material in the second walls to form beams that are elongated along the row direction and are suspended between immediately-adjacent of the first walls and to leave the second material directly under the first material in the first walls;

forming third walls along the row direction, the third walls comprising third material that is of different composition from those of the first and second materials, the third material of individual of the third walls circumferentially-covering the beams;

growing conductive material over the first and second materials selectively relative to the third material, the selectively-grown conductive material being vertically-along sidewalls of the first walls and comprising first capacitor electrodes;

removing the third walls after the selectively growing;

after removing the third walls, forming a capacitor insulator over the first capacitor electrodes and that circumferentially-covers the beams; and forming second capacitor electrodes over the capacitor insulator to form a plurality of capacitors that individually comprise one of the first capacitor electrodes, the capacitor insulator, and one of the second capacitor electrodes; the second capacitor electrodes being common to multiple of the capacitors.

22. The method of claim 21 wherein the capacitor insulator is formed atop the first walls and further comprising:

after forming the capacitor insulator, removing the first material from being atop the first walls and removing the beams.

23. The method of claim 21 wherein the beams having the capacitor insulator directly there-under remain in a finished-circuitry construction encompassing the array of capacitors.

24. The method of claim 21 wherein the beams having the capacitor insulator directly there-under and directly there-aside remain in a finished-circuitry construction encompassing the array of capacitors.

25. The method of claim 21 wherein the beams having the capacitor insulator directly there-under, directly there-aside, and directly there-atop remain in a finished-circuitry construction encompassing the array of capacitors.

* * * * *